(12) United States Patent
Hu et al.

(10) Patent No.: US 9,741,586 B2
(45) Date of Patent: Aug. 22, 2017

(54) METHOD OF FABRICATING PACKAGE STRUCTURES

(71) Applicant: Taiwan Semiconductor Manufacturing Company, Ltd., Hsin-Chu (TW)

(72) Inventors: Yu-Hsiang Hu, Hsin-Chu (TW); Chung-Shi Liu, Hsin-Chu (TW); Hung-Jui Kuo, Hsin-Chu (TW); Sih-Hao Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/755,529

(22) Filed: Jun. 30, 2015

(65) Prior Publication Data
US 2017/0004977 A1 Jan. 5, 2017

(51) Int. Cl.
*H01L 21/302* (2006.01)
*H01L 21/32* (2006.01)
*H01L 21/56* (2006.01)
*H01L 21/027* (2006.01)
*G03F 7/20* (2006.01)
*H01L 21/768* (2006.01)
(Continued)

(52) U.S. Cl.
CPC .............. *H01L 21/32* (2013.01); *G03F 7/20* (2013.01); *H01L 21/0273* (2013.01); *H01L 21/31127* (2013.01); *H01L 21/56* (2013.01); *H01L 21/76825* (2013.01); *H01L 21/02282* (2013.01); *H01L 21/76802* (2013.01); *H01L 2224/18* (2013.01); *H01L 2224/94* (2013.01)

(58) Field of Classification Search
CPC ......... H01L 21/02282; H01L 21/76825; H01L 21/312; H01L 21/56; H01L 21/0273; H01L 21/31127; H01L 21/76802; G03F 7/20

See application file for complete search history.

(56) References Cited

U.S. PATENT DOCUMENTS 5,486,424 A   1/1996 Nakato et al.
6,218,057 B1  4/2001 Cirelli et al.
(Continued)

FOREIGN PATENT DOCUMENTS

JP    2000331928 A    11/2000
KR    1020120098844 A  9/2012
TW    200709360       3/2007

*Primary Examiner* — Alonzo Chambliss
(74) *Attorney, Agent, or Firm* — Slater Matsil, LLP

(57) ABSTRACT

Some embodiments contemplate methods for forming a package structure and a package structure formed thereby. An embodiment method includes depositing a photosensitive dielectric layer on a support structure; forming a first layer on a surface of the photosensitive dielectric layer; exposing the photosensitive dielectric layer to radiation; and after the forming the first layer and the exposing to radiation, developing the photosensitive dielectric layer. The support structure includes an integrated circuit die. The layer has a different removal selectivity than the photosensitive dielectric layer during the developing. According to some embodiments, a thickness uniformity of the photosensitive dielectric layer after developing may be increased, and thickness loss from developing the photosensitive dielectric layer can be reduced.

20 Claims, 32 Drawing Sheets

(51) Int. Cl.
*H01L 21/311* (2006.01)
*H01L 21/02* (2006.01)

(56) References Cited

U.S. PATENT DOCUMENTS

| | | | |
|---|---|---|---|
| 7,083,991 B2 * | 8/2006 | Gaynor | H01L 21/31058 257/E21.242 |
| 7,416,990 B2 * | 8/2008 | Kim | G03F 7/11 216/66 |
| 7,910,405 B2 * | 3/2011 | Okada | H01L 21/561 257/E21.499 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,024,333 B2 * | 5/2015 | Jeong | H01L 33/12 257/87 |
| 2005/0158884 A1 * | 7/2005 | Gaynor | H01L 21/31058 438/4 |
| 2006/0115774 A1 | 6/2006 | Wang et al. | |
| 2006/0246373 A1 | 11/2006 | Wang | |
| 2007/0138137 A1 * | 6/2007 | Kim | G03F 7/11 216/63 |
| 2007/0232061 A1 * | 10/2007 | Okada | H01L 21/561 438/628 |
| 2010/0330471 A1 | 12/2010 | Bae et al. | |
| 2011/0215464 A1 | 9/2011 | Guzek et al. | |
| 2011/0291288 A1 | 12/2011 | Wu et al. | |
| 2012/0248553 A1 * | 10/2012 | Takano | B81C 1/0023 257/415 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0183627 A1 | 7/2013 | Shibazaki | |
| 2013/0307140 A1 | 11/2013 | Huang et al. | |
| 2014/0167238 A1 | 6/2014 | Jeon et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0140729 A1 | 5/2015 | Ferro et al. | |

* cited by examiner

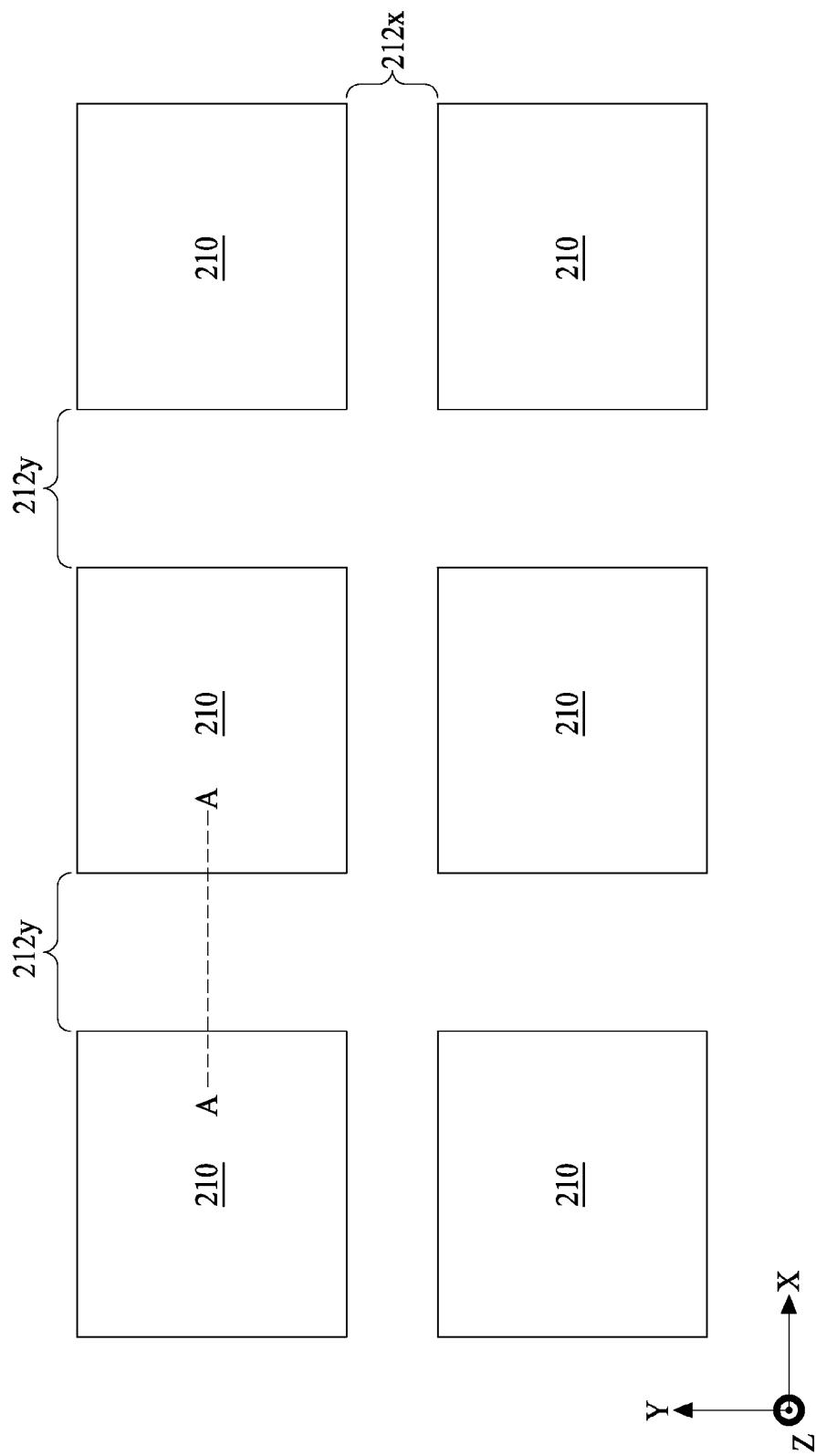

US 9,741,586 B2

METHOD OF FABRICATING PACKAGE STRUCTURES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. In some devices, multiple dies or packages with active devices or circuits are stacked vertically to reduce the footprint of a device package and permit dies with different processing technologies to be interconnected. Interconnections for this vertical stacking can be created on the top and bottom surfaces of a substrate by forming redistribution layers (RDLs) with conductive lines in insulating layers. The RDLs and the dies external to a particular package are electrically connected to dies in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 32 is a layout to illustrate aspects of scribe line regions in accordance with some embodiments.

DETAILED DESCRIPTION

Figure 1:
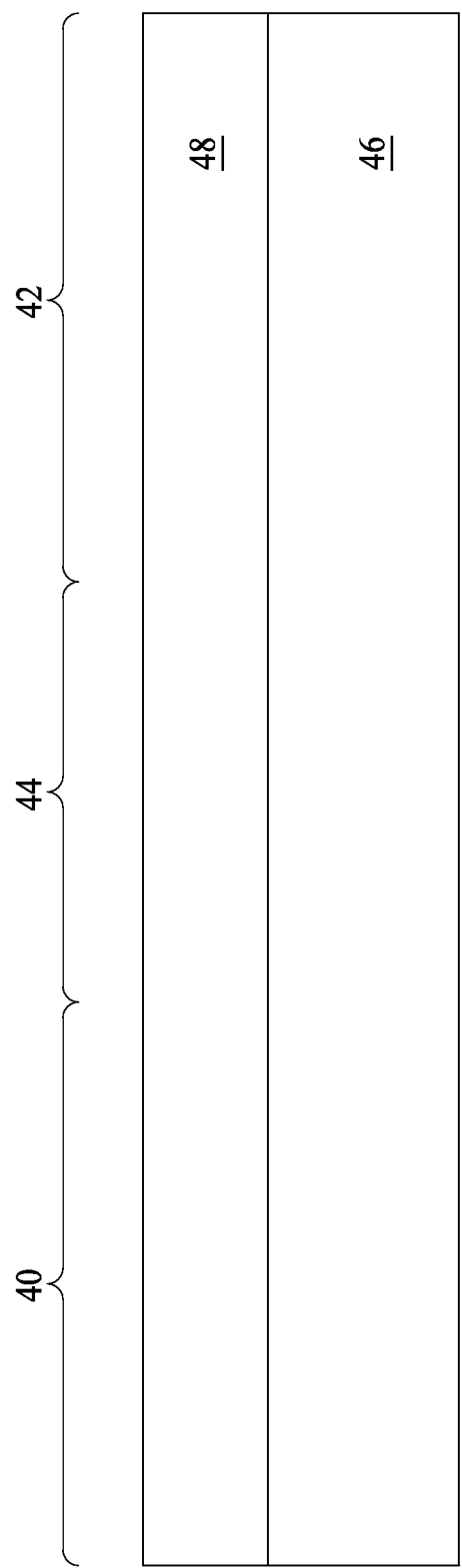
FIGS. 1 through 4 are cross sectional views of intermediate structures of a first generic process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a fan-out or fan-in wafer-level package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

Figure 3:
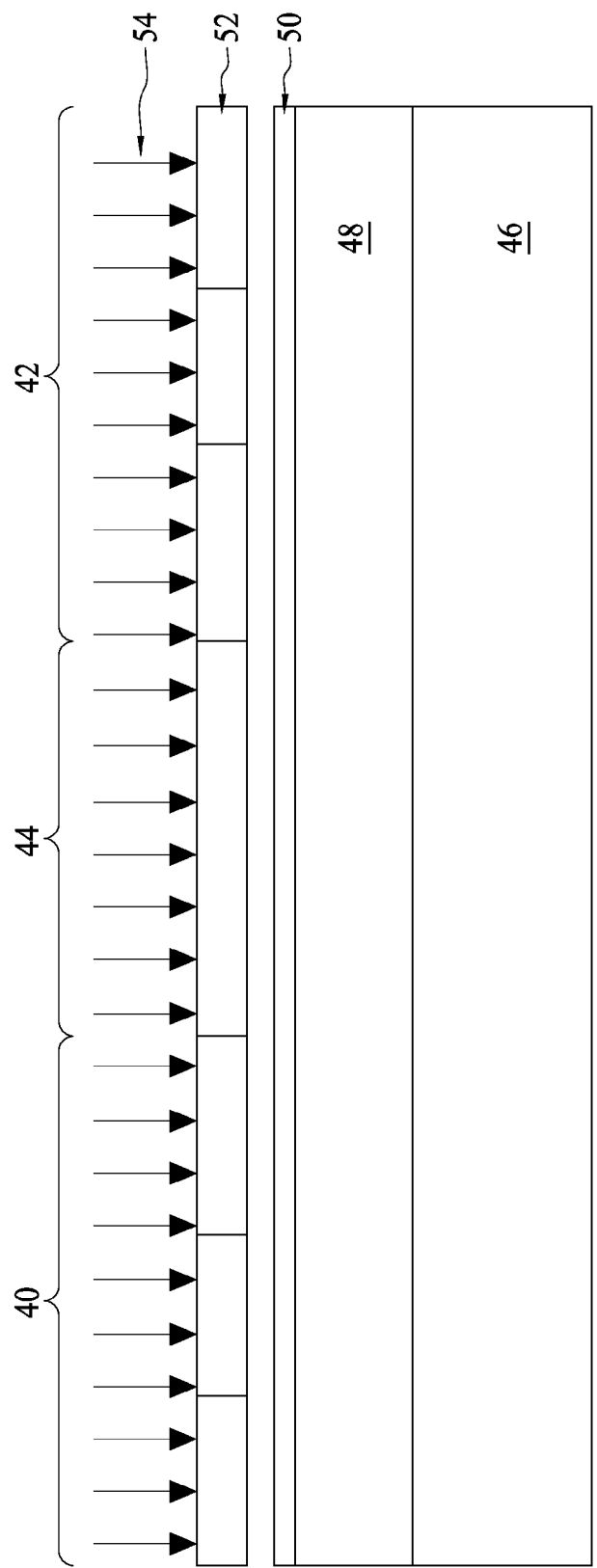
Figure 4:
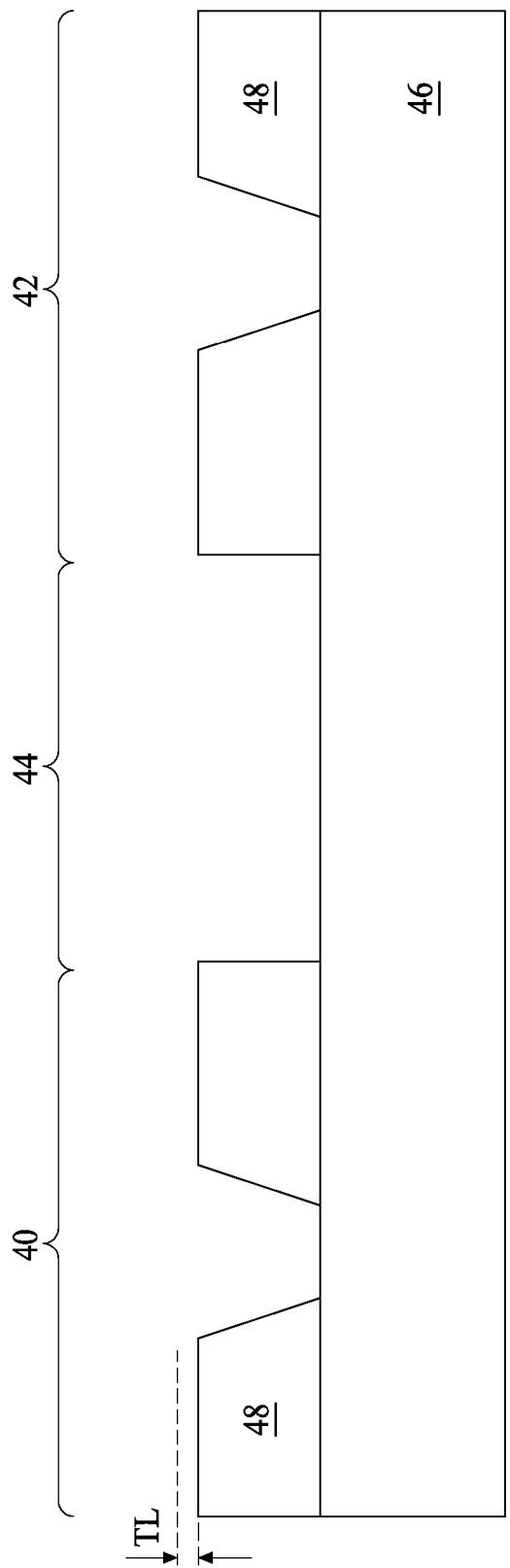
Figure 5:
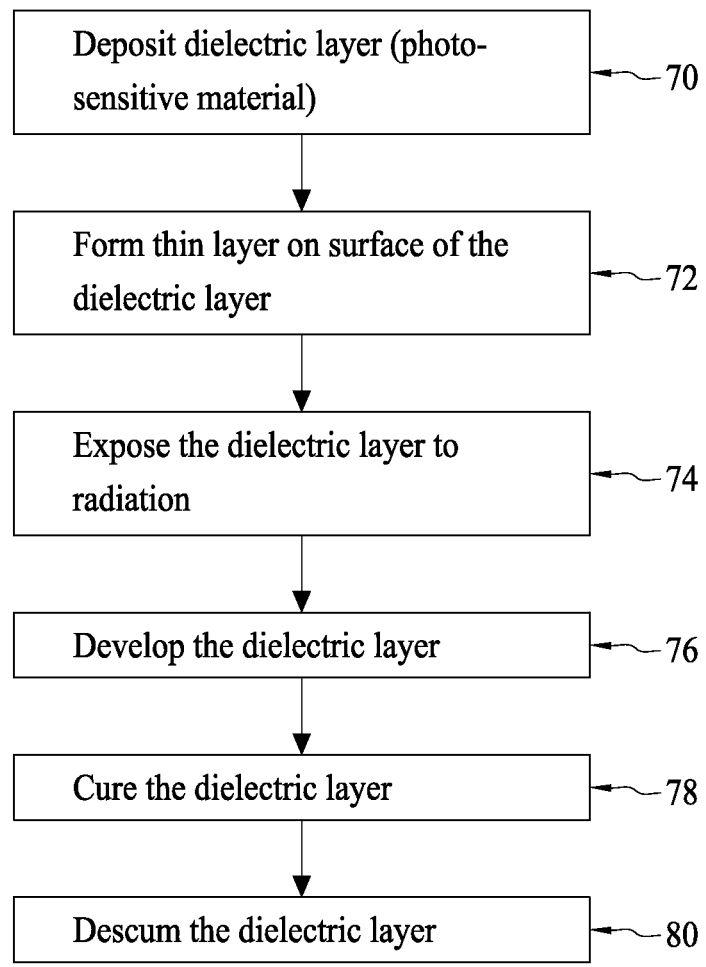
FIG. 5 is a process flow of the first generic process in accordance with some embodiments.

FIGS. 1 through 4 illustrate cross sectional views of intermediate structures of a first generic process to illustrate various general concepts according to some embodiments, and FIG. 5 is a process flow of the first generic process according to some embodiments. FIG. 1 illustrates a support structure 46 with a first region 40, a second region 42, and a scribe line region 44 between the first region 40 and the second region 42. The support structure 46 can include various structures formed in the first region 40 and the second region 42. Such structures can include an integrated circuit die, an encapsulated integrated circuit die, a substrate, or the like. An example of such a structure, and its formation, is illustrated in FIGS. 18 through 31.

As illustrated in FIG. 1 and in step 70 of FIG. 5, a dielectric layer 48 is deposited on the support structure 46, such as by spin coating, lamination, or the like. The dielectric layer 48 is a photo-sensitive material, which can be positive or negative tone, and can further be a polymer, such as polybenzoxazole (PBO), polyimide, benzocyclobutene (BCB), or the like. In some embodiments, the dielectric layer 48 may be deposited in a liquid state, such as by spin coating. The dielectric layer 48 can be pre-baked or soft-baked in embodiments where the dielectric layer is deposited in a liquid state, such as at a temperature in a range from about 100° C. to about 125° C., like 120° C., at a duration in a range from about 60 seconds to about 600 seconds, such as 300 seconds. The pre-bake or soft-bake may be performed in situ in, e.g., the spin coater chamber used to deposit the dielectric layer 48. In embodiments where the dielectric layer is deposited in a liquid state, a solvent in the liquid state dielectric layer 48 may evaporate such that, for example, 10% of the dielectric layer 48 is solvent, and the dielectric layer 48 is in a semi-solid state. In some embodiments, the dielectric layer 48 upon deposition has a thickness in a range from about 6 µm to about 18 µm, such as about 16 µm to about 18 µm.

Figure 2:
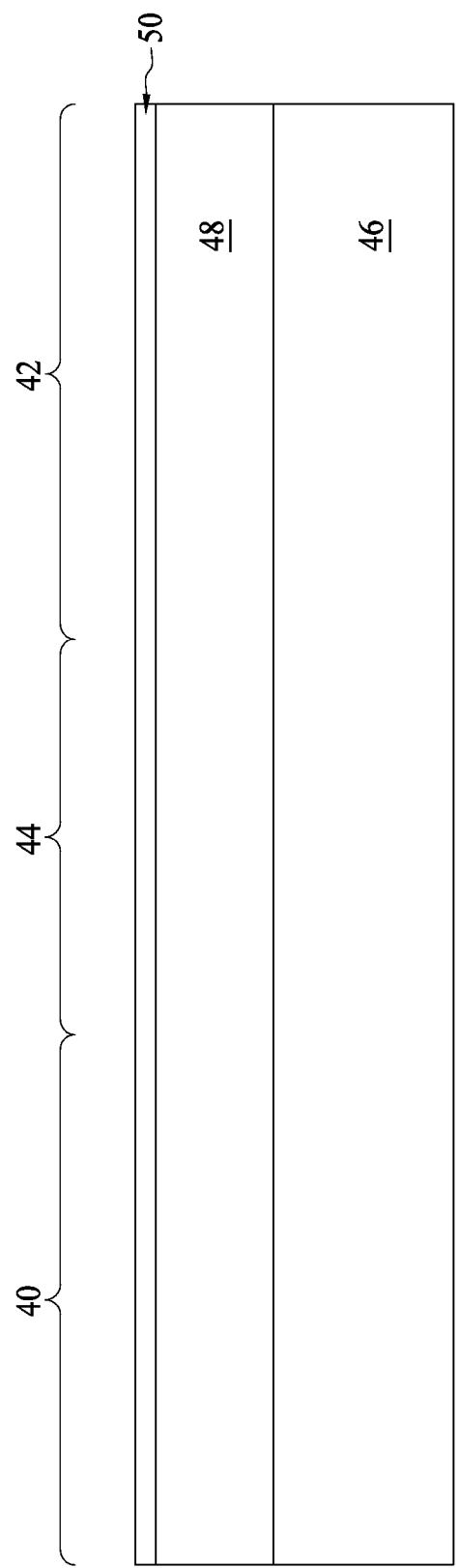

In FIG. 2 and step 72 of FIG. 5, a thin layer 50 is formed on an upper surface of the dielectric layer 48. During this formation, the dielectric layer 48 can be in a solid or semi-solid state. In some embodiments, the formation of the thin layer 50 includes modifying the upper surface of the dielectric layer 48. The modification can include exposing the upper surface to a precursor, such as a hexamethyldisilazane (HMDS) ($[(CH_3)_3Si]_2NH$) gas or the like. Further, in some embodiments, the upper surface of the dielectric layer 48 is exposed to the precursor, e.g., HMDS gas, in situ after the deposition. For example, if the dielectric layer 48 is deposited using spin coating in a spin coater chamber, the HMDS gas can be provided in the spin coater chamber while the support structure 46 and dielectric layer 48 remain in the spin coater chamber. The upper surface of the dielectric layer 48 may be exposed to the precursor, e.g., the HMDS gas, using a flow rate of the precursor in a range from about 50 sccm to about 100 sccm, such as about 50 sccm, at a temperature in a range from about 80° C. to about 150° C., such as about 100° C., for a duration in a range from about 30 seconds to about 90 seconds, such as about 60 seconds.

Figure 6:
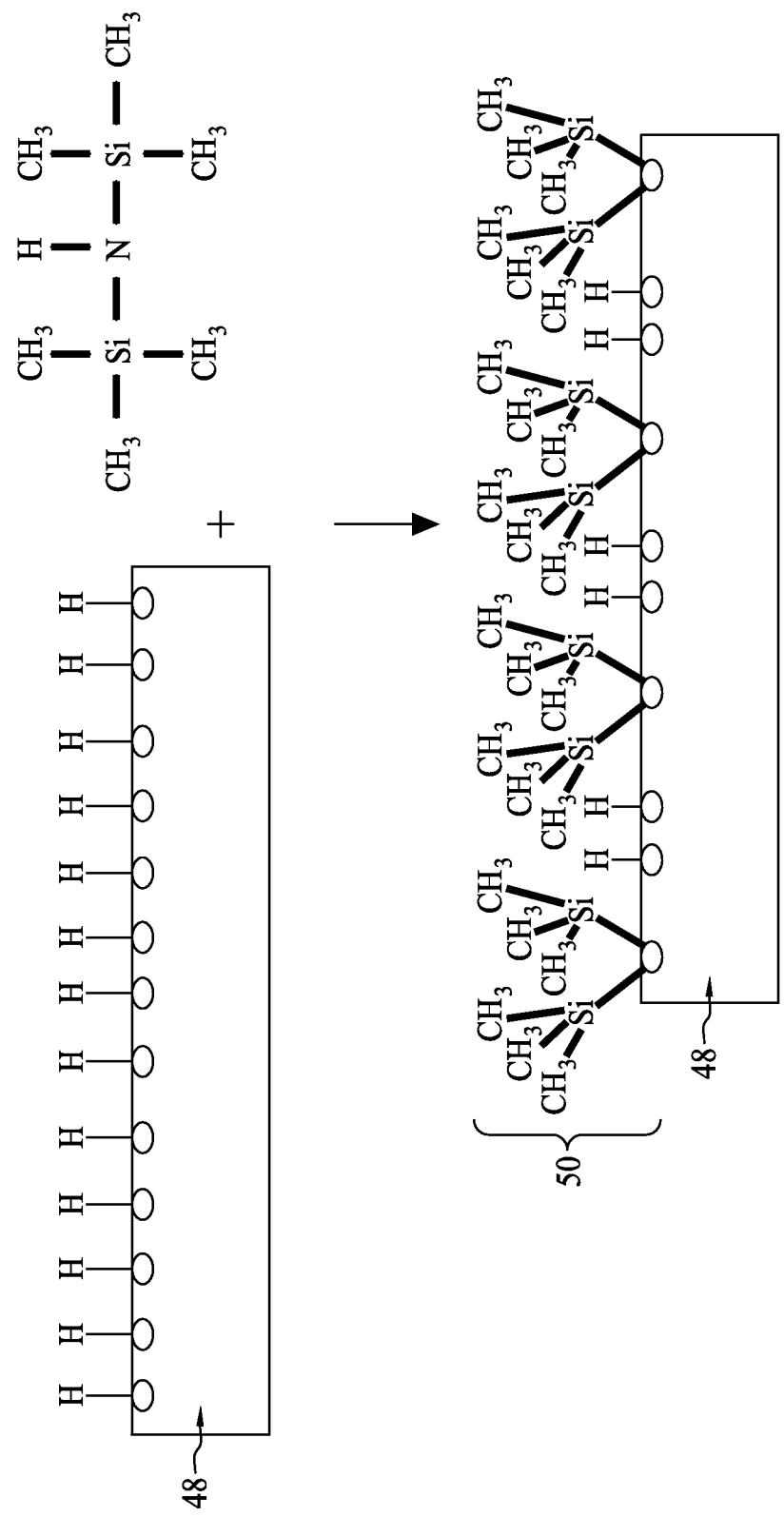
FIG. 6 illustrates a chemical reaction that may occur by treating an upper surface of a dielectric layer with hexamethyldisilazane (HMDS) gas in accordance with some embodiments.

FIG. 6 illustrates a chemical reaction that may occur by treating the upper surface of the dielectric layer 48 with HMDS gas. The upper surface may have exposed hydroxide groups which when exposed to HMDS gas can react with the HMDS gas. Trimethylsilyl groups chemically bond with the oxygen of the hydroxide groups to form a self-assembled monolayer (SAM) along the upper surface of the dielectric layer 48. In this embodiment, the SAM may include hexamethyldisiloxane (HMDSO) ($O[Si(CH_3)_3]_2$). A byproduct of the reaction can be amidogen ($NH_2$). The upper surface of the dielectric layer 48 may be unsaturated (as illustrated) or saturated with HMDSO to form the SAM. Further, the SAM may include HMDS physically adsorbed on the upper surface of the dielectric layer 48 (not specifically illustrated). In these embodiments, the SAM, which can include the HMDSO and/or HMDS, is the thin layer 50 as illustrated in FIG. 6. The SAM can have a thickness in a range from about 5 nm to about 50 nm, such as about 10 nm.

In other embodiments, the thin layer 50 can be a photo resist layer formed on the upper surface of the dielectric layer 48. The photo resist layer can be a photo resist used in front-end of the line semiconductor processing and may be a nanometer scale layer. The thickness of the photo resist layer can be in a range from about 80 nm to about 1000 nm, such as about 100 nm.

More generically, the formation of the thin layer 50 in step 72 can include any exposure to a gas, liquid, or material; treatment; deposition; or the like that improves removal selectivity between exposed and un-exposed portions of the dielectric layer 48 during a subsequent developing step. For example, the thin layer 50 can cause the developing step to remove less of the un-exposed portions of the dielectric layer 48 compared to a removal of un-exposed portions of the dielectric layer without the thin layer 50. In some embodiments where HMDS gas is used to modify a PBO dielectric layer, it has been discovered that a ratio of removal of exposed PBO to un-exposed PBO during developing increased to 4.7, whereas a ratio of removal of exposed PBO to un-exposed PBO during developing without a thin layer formation step was 3.4. The thin layer 50 can have a different removal selectivity than the dielectric layer 48. Hence, physical removal during developing can cause removal of soluble portions of the dielectric layer 48 and overlying portions of the thin layer 50, while the thin layer 50 over the non-soluble portions of the dielectric layer 48 generally remains, which can reduce the chemical removal the non-soluble portions of the dielectric layer 48.

In FIG. 3 and step 74 of FIG. 5, the dielectric layer 48 is exposed to radiation. A lithography mask 52 can be used during the exposure. The lithography mask 52 can have a pattern that corresponds to a pattern to be formed in the dielectric layer 48. Radiation 54 can be transmitted through and/or blocked by the lithography mask 52 to expose the dielectric layer 48 to the radiation 54 according to the pattern of the lithography mask 52. The radiation 54 can be, for example, a combination of multiple wavelengths of light, such as a spectrum of g-, h-, and i-line having wavelengths of 436 nm, 405 nm, and 365 nm, respectively; ultraviolet radiation; far ultraviolet radiation, x-rays; electron beams; or the like. In the illustrated embodiment, the dielectric layer 48 is positive tone such that portions of the dielectric layer 48 exposed to the radiation 54 though the lithography mask 52 become soluble and are removed during developing. Other embodiments contemplate that the dielectric layer 48 is negative tone such that portions of the dielectric layer 48 that are not exposed to the radiation 54 though the lithography mask 52 are soluble and are removed during developing.

In step 76 of FIG. 5, the dielectric layer 48 is developed. The developing can include using a wet process to remove soluble portions of the dielectric layer 48 after the exposure in step 74. The wet process can include using tetramethylammonium hydroxide (TMAH) in a spin-on process or the like.

In step 78 of FIG. 5, the dielectric layer 48 is cured after being developed. The curing may be performed by placing the support structure 46 and the dielectric layer 48 in an oven or furnace for a duration in a range from about 0.5 hours to about 5 hours, such as 1 hour, at a temperature in a range from about 100° C. to about 250° C., such as 220° C.

In step 80 of FIG. 5, the support structure 46 and the dielectric layer 48 undergo a descum process. The descum process can include a plasma process, such as an oxygen ($O_2$) plasma process. The descum process can remove residue from the developing and curing of the dielectric layer 48 and can remove, for example, up to about 0.5 µm of the dielectric layer 48. FIG. 4 illustrates the support structure 46 and the dielectric layer 48 after the descum process. FIG. 4 illustrates a thickness loss TL of the dielectric layer 48, which is the loss of thickness of the dielectric layer 48 from developing, curing, and descum. Further, as illustrated in FIG. 4, no residue of the dielectric layer 48 is in the scribe line region 44 and in the vias and/or openings through the dielectric layer 48 in the first region 40 and the second region 42.

The inventors have performed the process outlined in FIG. 5 using exposure to HMDS gas as the thin layer formation step 72 under various conditions, and the process of FIG. 5 without the thin layer formation step 72. The results of these processes show decreased thickness loss TL and increased layer thickness uniformity in the samples using the HMDS surface modification. Sample 1 in Table 1 below is a dielectric layer formed without a thin layer formation step 72 being performed. Sample 2 in Table 1 is a dielectric layer formed according to FIG. 5 with an HMDS gas exposure at 100° C. for a duration of 60 seconds as the thin layer formation step 72. Sample 3 in Table 1 is a dielectric layer formed according to FIG. 5 with an HMDS gas exposure at 120° C. for a duration of 60 seconds as the thin layer formation step 72.

TABLE 1

|  | Sample 1 | Sample 2 | Sample 3 |
|---|---|---|---|
| Post-Deposition Thickness | 17.35 μm | 17.38 μm | 17.4 μm |
| Post-Deposition Thickness standard deviation percentage | 1.41% | 1.41% | 1.41% |
| Post-Development Thickness | 12.24 μm | 14.43 μm | 17.31 μm |
| Post-Development Thickness standard deviation percentage | 4.05% | 3.99% | 1.42% |
| Thickness Loss | 5.11 μm | 2.95 μm | 0.09 μm |

Further, measurements were taken at various locations within the wafers of Samples 1 and 2 after curing and descum. The wafers of Samples 1 and 2 contain various die-containing regions throughout the wafers. In Sample 1, a thickness of the dielectric layer at the wafer center and a first die center was 10.32 μm, at the wafer center and the first die edge was 9.42 μm, at the wafer edge and a second die center was 10.23 μm, and at the wafer edge and the second die edge was 9.91 μm. In Sample 2, a thickness of the dielectric layer at the wafer center and a first die center was 12.31 μm, at the wafer center and the first die edge was 12.21 μm, at the wafer edge and a second die center was 12.21 μm, and at the wafer edge and the second die edge was 11.56 μm. From these measurements and Table 1, it has been found that the thin layer 50 formed using HMDS can decrease thickness loss of the dielectric layer and can improve thickness uniformity throughout a die region and the wafer. For example, a standard deviation of the thickness of the dielectric layer across multiple die-containing regions, e.g., across the wafer, can be equal to or less than 4%, and further, can be equal to or less than 1.5%, such as 1.42%. Even further, a standard deviation of the thickness of the dielectric layer across one die-containing region can be equal to or less than 1%, such as equal to or less than 0.5%.

Figure 9:
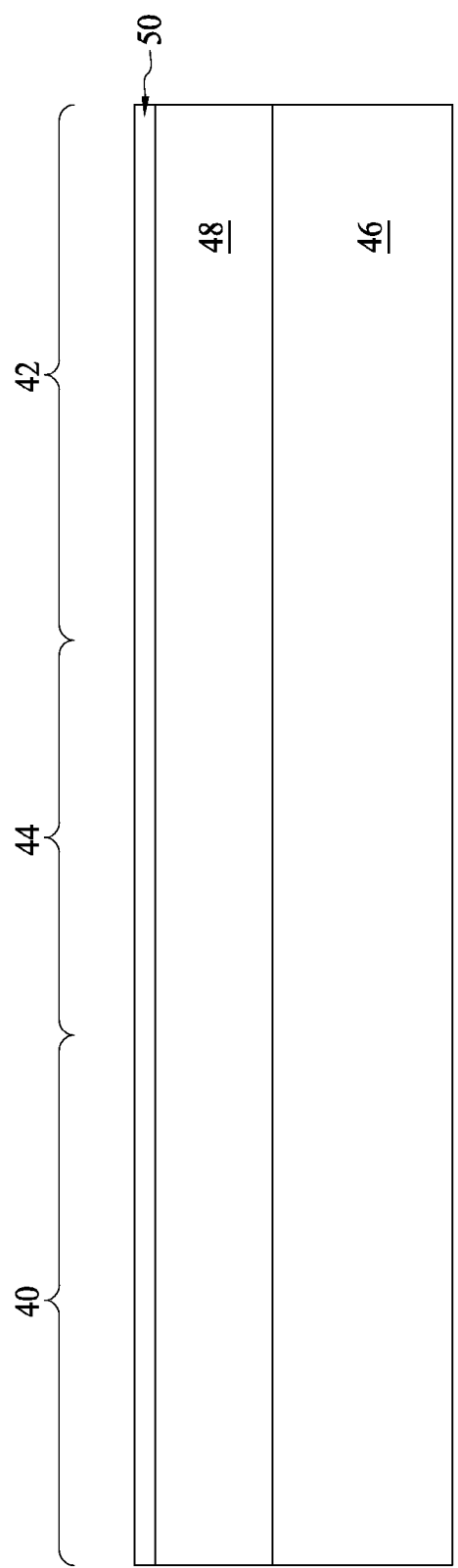
Figure 10:
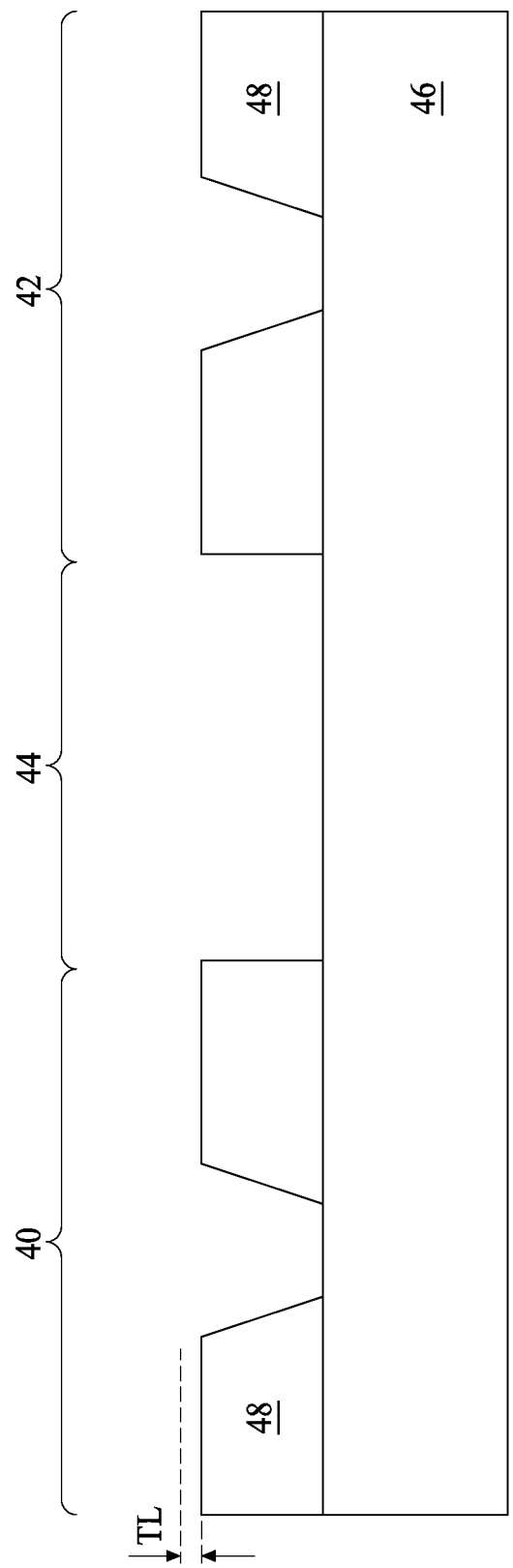
Figure 11:
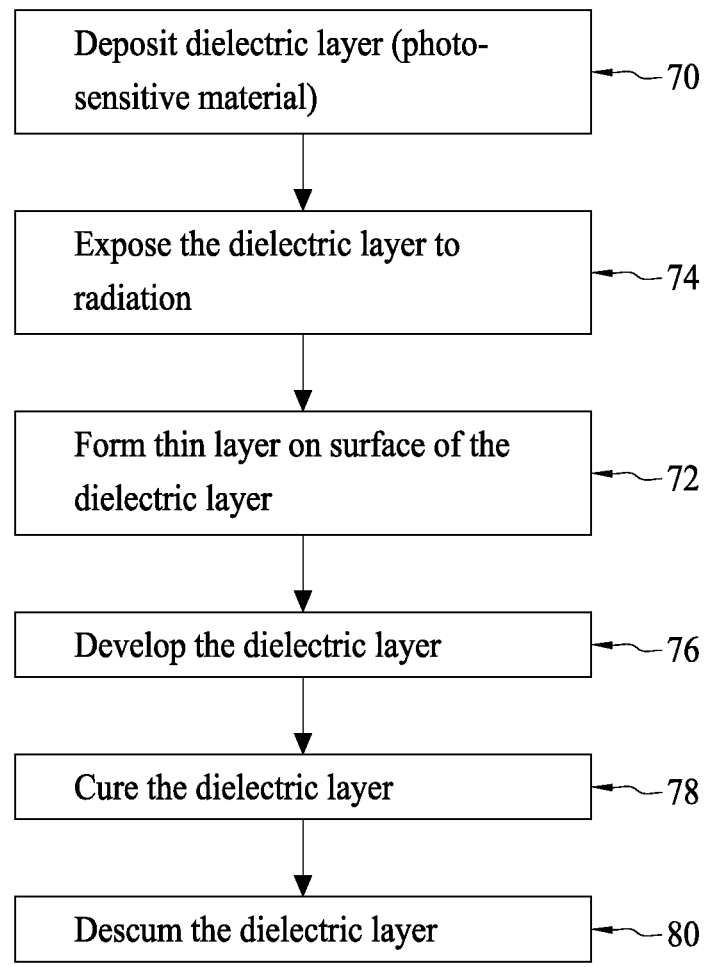
FIG. 11 is a process flow of the second generic process in accordance with some embodiments.

FIG. 9 and step 72 of FIG. 11, a thin layer 50 is formed on an upper surface of the dielectric layer 48 as discussed with respect to FIG. 2 and step 72 of FIG. 5. In step 76 of FIG. 11, the dielectric layer 48 is developed as discussed with respect to step 76 of FIG. 5. In step 78 of FIG. 11, the dielectric layer 48 is cured after being developed as discussed with respect to step 78 of FIG. 5. In step 80 of FIG. 11, the support structure 46 and the dielectric layer 48 undergo a descum process as discussed with respect to step 80 of FIG. 5. FIG. 10 illustrates the support structure 46 and the dielectric layer 48 after the descum process. FIG. 10 illustrates a thickness loss TL of the dielectric layer 48, which is the loss of thickness of the dielectric layer 48 from developing, curing, and descum. Further, as illustrated in FIG. 10, no residue of the dielectric layer 48 is in the scribe line region 44 and in the vias and/or openings through the dielectric layer 48 in the first region 40 and the second region 42.

The inventors have performed the process outlined in FIG. 11 using exposure to HMDS gas as the thin layer formation step 72 under various conditions, and the process of FIG. 11 without the thin layer formation step 72. The results of these processes show decreased thickness loss TL in the samples using the HMDS surface modification. Sample 1 in Table 2 below is a dielectric layer formed without a thin layer formation step 72 being performed. Sample 2 in Table 2 is a dielectric layer formed according to FIG. 11 with an HMDS gas exposure at 100° C. for a duration of 45 seconds as the thin layer formation step 72. Sample 3 in Table 2 is a dielectric layer formed according to FIG. 11 with an HMDS gas exposure at 100° C. for a duration of 60 seconds as the thin layer formation step 72. Sample 4 in Table 2 is a dielectric layer formed according to FIG. 11 with an HMDS gas exposure at 105° C. for a duration of 45 seconds as the thin layer formation step 72. Sample 5 in Table 2 is a dielectric layer formed according to FIG. 11 with an HMDS gas exposure at 105° C. for a duration of 60 seconds as the thin layer formation step 72. Sample 6 in Table 2 is a dielectric layer formed according to FIG. 11 with an HMDS gas exposure at 110° C. for a duration of 30 seconds as the thin layer formation step 72.

TABLE 2

|  | Sample 1 | Sample 2 | Sample 3 | Sample 4 | Sample 5 | Sample 6 |
|---|---|---|---|---|---|---|
| Post-Deposition Thickness | 16.81 μm | 16.52 μm | 16.56 μm | 16.61 μm | 16.59 μm | 16.61 μm |
| Post-Development Thickness | 11.67 μm | 12.52 μm | 12.87 μm | 13.58 μm | 13.81 μm | 13.68 μm |
| Thickness Loss | 5.14 μm | 4.00 μm | 3.69 μm | 2.99 μm | 2.80 μm | 2.93 μm |

Figure 7:
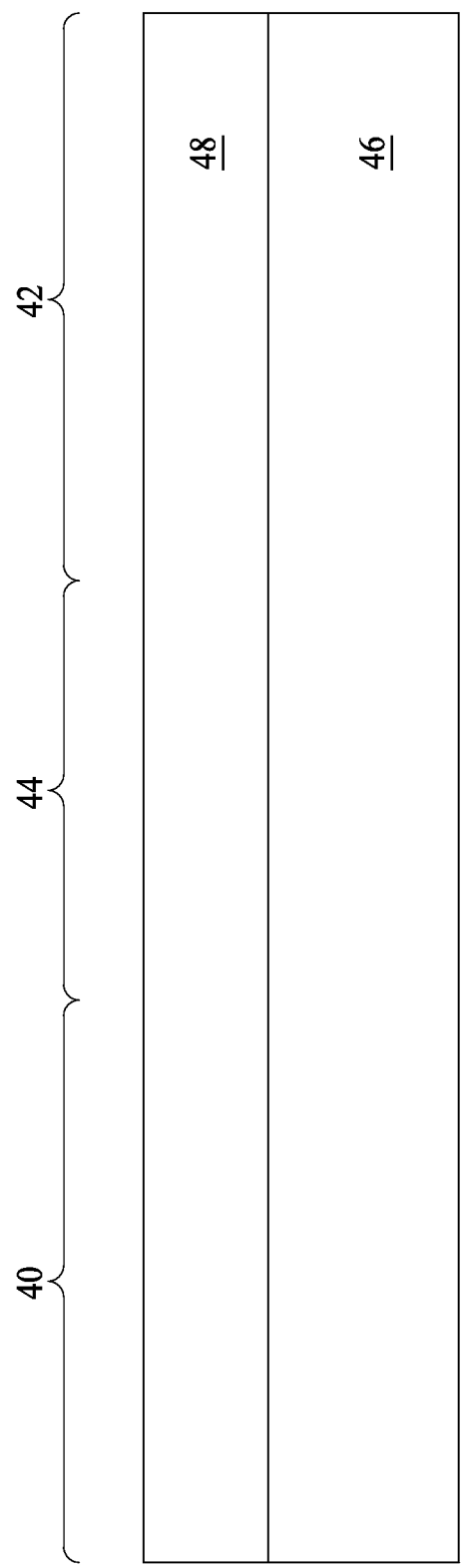
FIGS. 7 through 10 are cross sectional views of intermediate structures of a second generic process in accordance with some embodiments.
Figure 8:
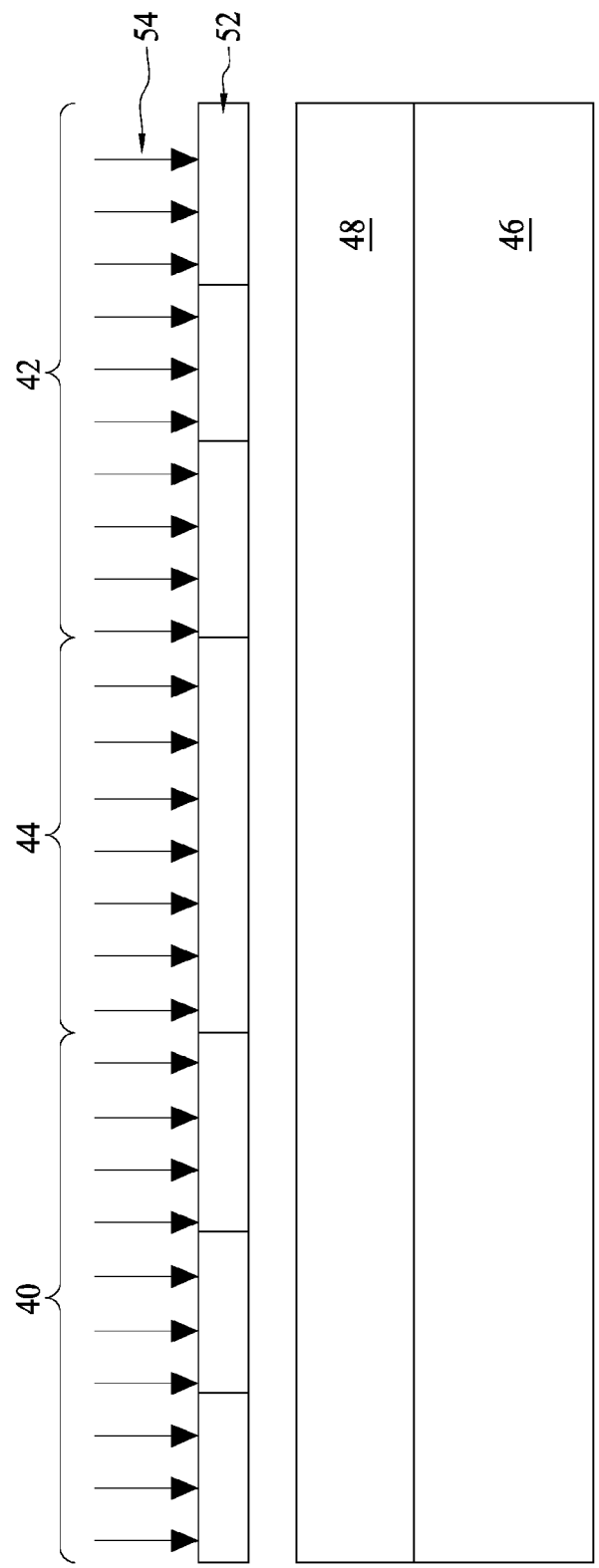
Figure 12:
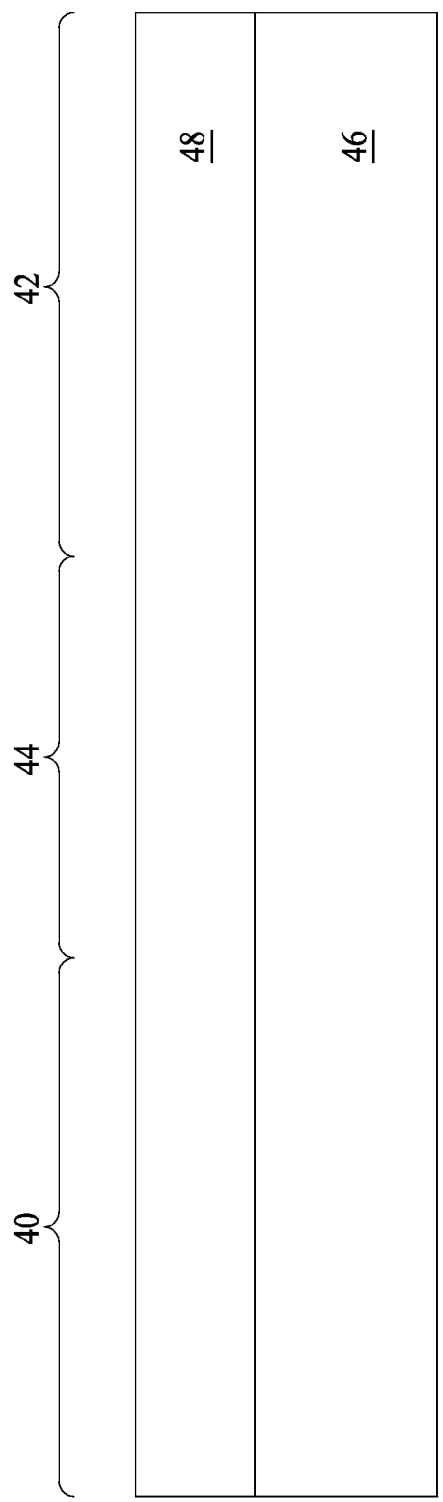
FIGS. 12 through 16 are cross sectional views of intermediate structures of a third generic process in accordance with some embodiments.
Figure 13:
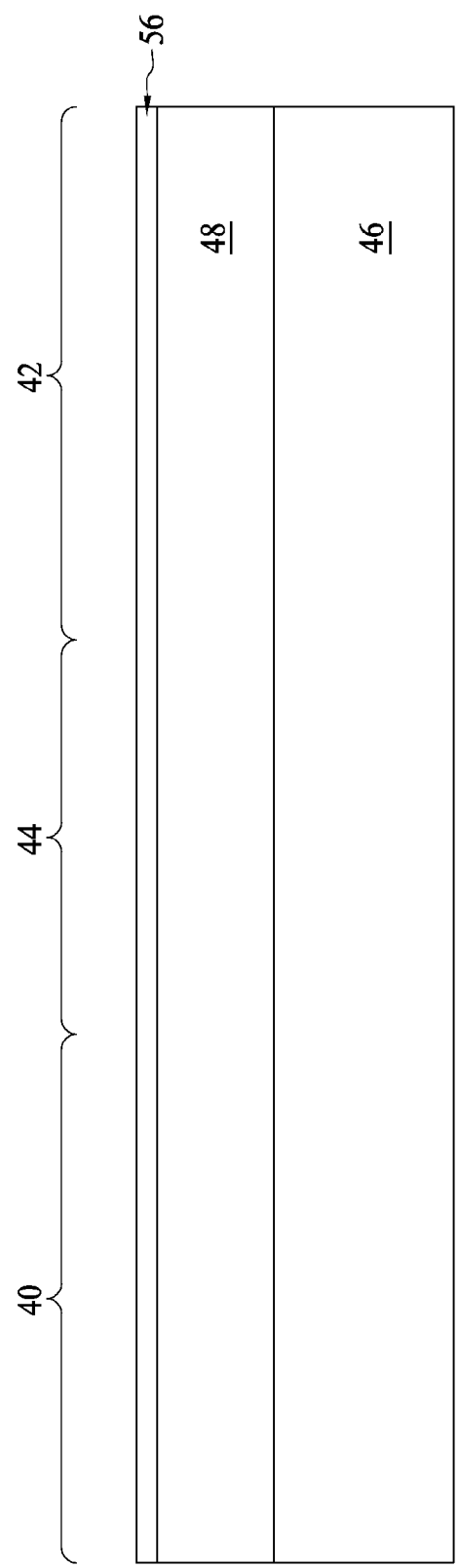
Figure 14:
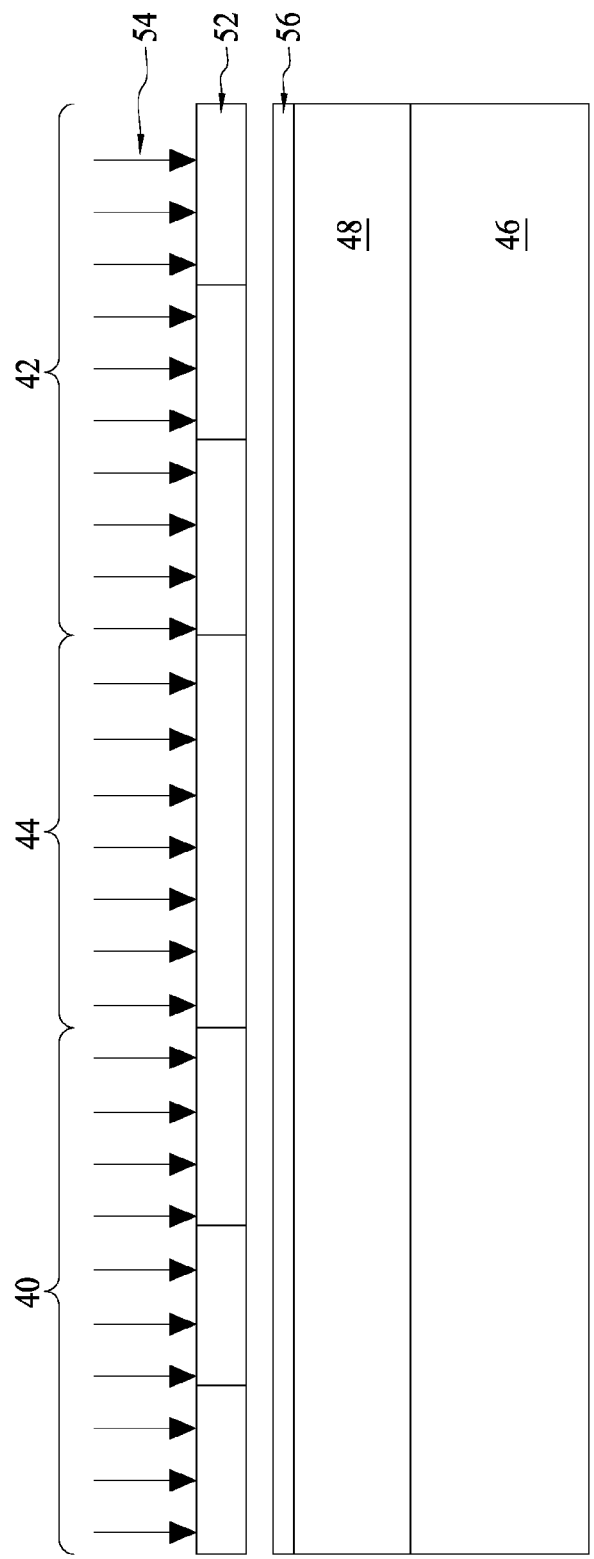
Figure 15:
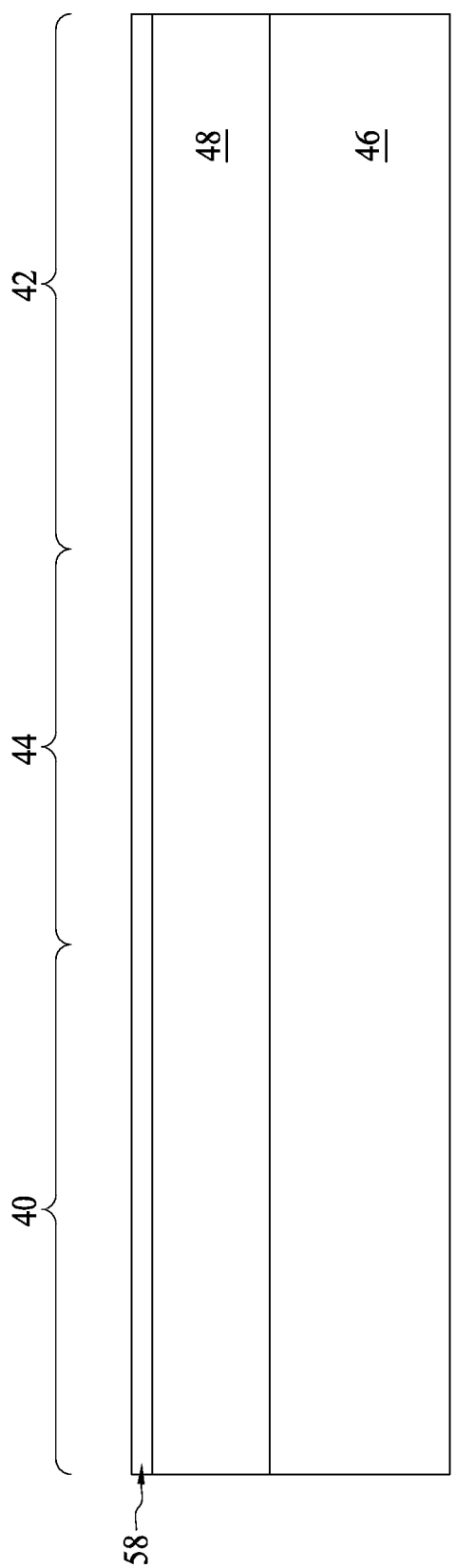
Figure 16:
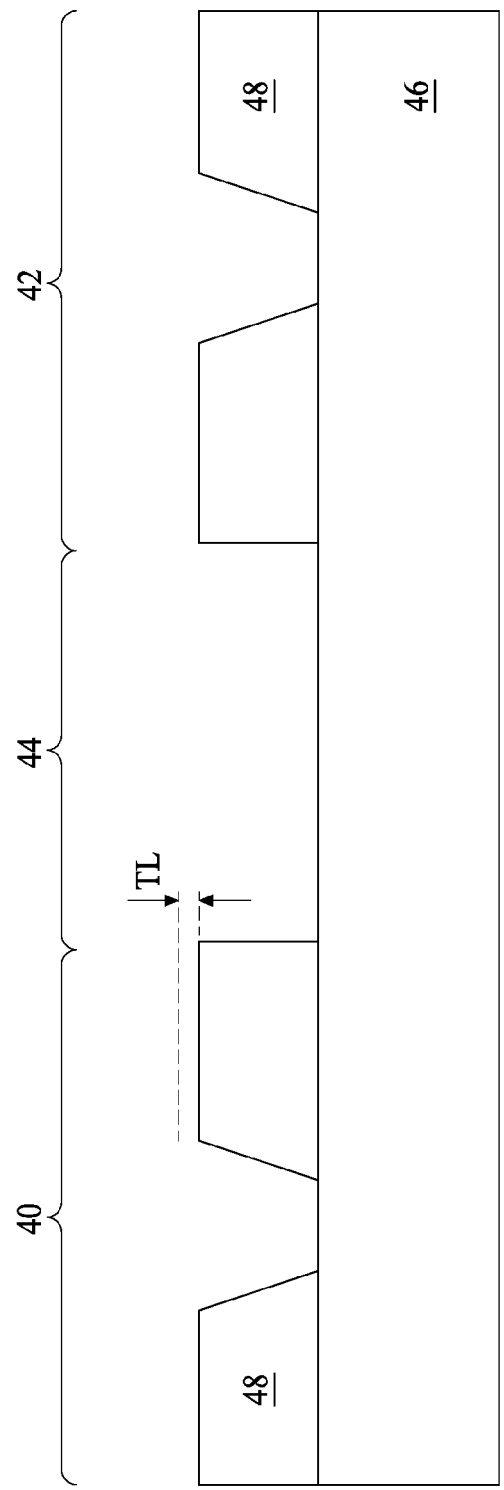
Figure 17:
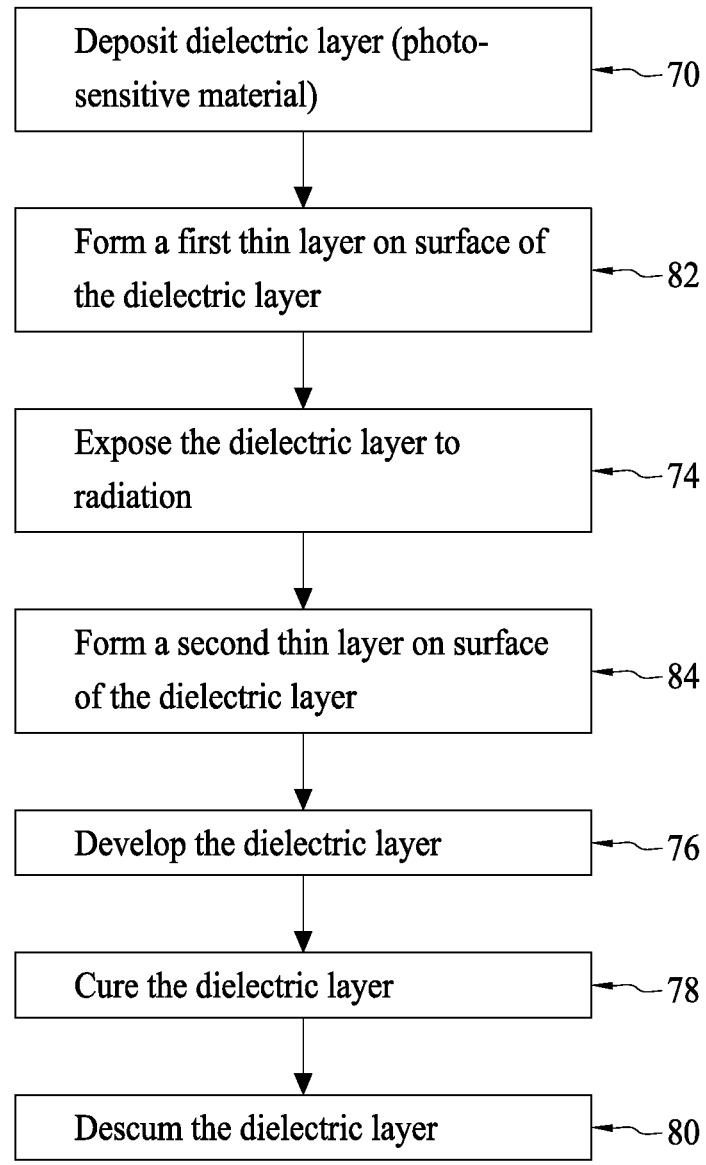
FIG. 17 is a process flow of the third generic process in accordance with some embodiments.

FIGS. 7 through 10 illustrate cross sectional views of intermediate structures of a second generic process to illustrate various general concepts according to some embodiments, and FIG. 11 is a process flow of the second generic process according to some embodiments. As in FIG. 1, FIG. 7 illustrates a support structure 46 with a first region 40, a second region 42, and a scribe line region 44 between the first region 40 and the second region 42. As illustrated in FIG. 7 and in step 70 of FIG. 11, a dielectric layer 48 is deposited on the support structure 46 as discussed with respect to FIG. 1 and step 70 of FIG. 5. In FIG. 8 and step 74 of FIG. 11, the dielectric layer 48 is exposed to radiation as discussed with respect to FIG. 3 and step 74 of FIG. 5. In FIGS. 12 through 16 illustrate cross sectional views of intermediate structures of a third generic process to illustrate various general concepts according to some embodiments, and FIG. 17 is a process flow of the third generic process according to some embodiments. As in FIG. 1, FIG. 12 illustrates a support structure 46 with a first region 40, a second region 42, and a scribe line region 44 between the first region 40 and the second region 42. As illustrated in FIG. 12 and in step 70 of FIG. 17, a dielectric layer 48 is deposited on the support structure 46 as discussed with respect to FIG. 1 and step 70 of FIG. 5. In FIG. 13 and step 82 of FIG. 17, a first thin layer 56 is formed on an upper surface of the dielectric layer 48 as discussed with respect to FIG. 2 and step 72 of FIG. 5. In FIG. 14 and step 74 of FIG. 17, the dielectric layer 48 is exposed to radiation as discussed with respect to FIG. 3 and step 74 of FIG. 5. In FIG. 15 and step 84 of FIG. 17, a second thin layer 58 is formed on an upper surface of the dielectric layer 48 as discussed with respect to FIG. 2 and step 72 of FIG. 5. The second thin layer 58 may be on and/or intermingled with the first thin layer 56 in the illustrated embodiment. The different thin layer formation steps may use, for example, a same formation process at different times in the process (e.g., steps 82 and 84 both use a HMDS gas surface modification) or may use different formation processes (e.g., step 82 uses a HMDS gas surface modification, and step 84 uses a thin photo resist). In step 76 of FIG. 17, the dielectric layer 48 is developed as discussed with respect to step 76 of FIG. 5. In step 78 of FIG. 17, the dielectric layer 48 is cured after being developed as discussed with respect to step 78 of FIG. 5. In step 80 of FIG. 17, the support structure 46 and the dielectric layer 48 undergo a descum process as discussed with respect to step 80 of FIG. 5. FIG. 16 illustrates the support structure 46 and the dielectric layer 48 after the descum process. FIG. 16 illustrates a thickness loss TL of the dielectric layer 48, which is the loss of thickness of the dielectric layer 48 from developing, curing, and descum. Further, as illustrated in FIG. 16, no residue of the dielectric layer 48 is in the scribe line region 44 and in the vias and/or openings through the dielectric layer 48 in the first region 40 and the second region 42.

Figure 18:
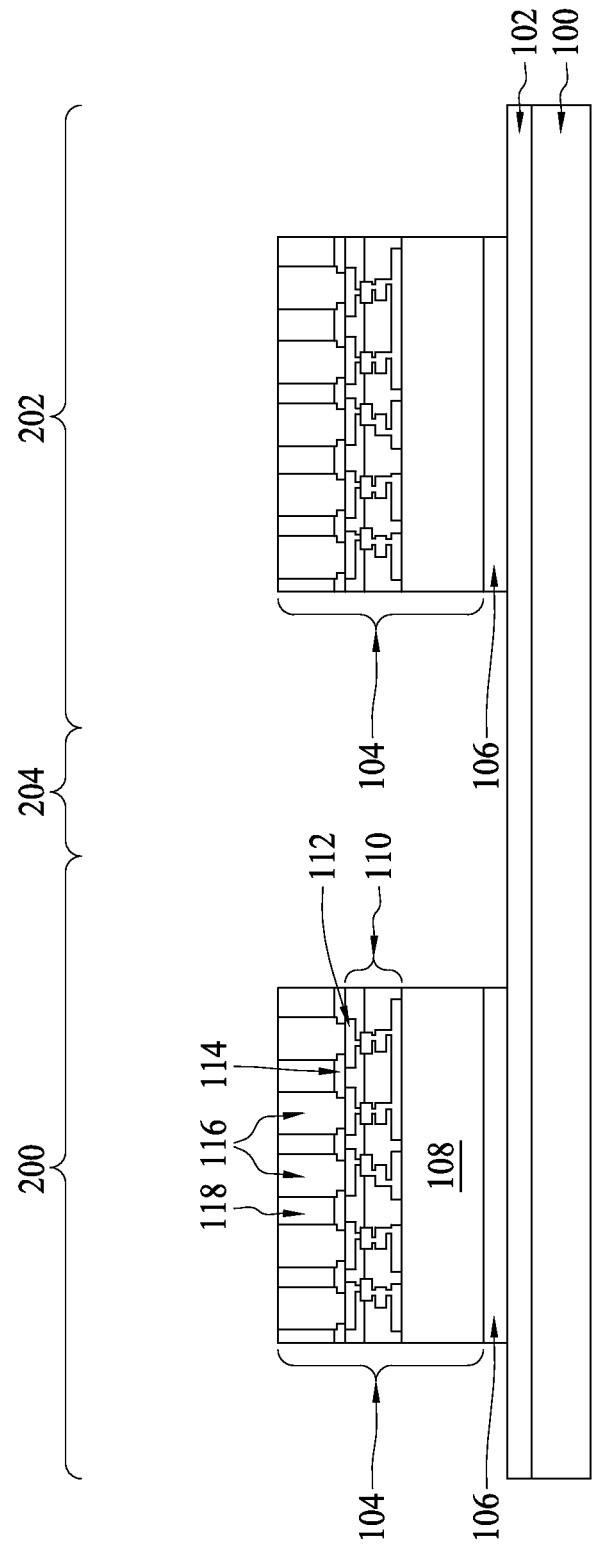
FIGS. 18 through 31 are cross sectional views of intermediate steps during a process for forming a package structure in accordance with some embodiments.

FIGS. 18 through 31 illustrate cross sectional views of intermediate steps during a process for forming a package structure in accordance with some embodiments. FIG. 18 illustrates a carrier substrate 100 and a release layer 102 formed on the carrier substrate 100. A first package region 200 and a second package region 202 for the formation of a first package and a second package, respectively, are illustrated. A scribe line region 204 is between the first package region 200 and the second package region 202. One having ordinary skill in the art will readily understand that scribe line regions can circumscribe each of the first package region 200 and the second package region 202, and that discussion relating to the scribe line region 204 similarly applies to other scribe line regions.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a Light-to-Heat-Conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of co-planarity.

Further in FIG. 18, integrated circuit dies 104 are adhered to the release layer 102 by an adhesive 106. As illustrated, one integrated circuit die 104 is adhered in each of the first package region 200 and the second package region 202, and in other embodiments, more integrated circuit dies may be adhered in each region. Before being adhered to the release layer 102, the integrated circuit dies 104 may be processed according to applicable manufacturing processes to form integrated circuits in the integrated circuit dies 104. For example, the integrated circuit dies 104 each comprise a semiconductor substrate 108, such as a bulk semiconductor substrate, a semiconductor-on-insulator (SOI) substrate, a multi-layered or gradient substrate, or the like. The semiconductor substrate 108 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or combinations thereof. The semiconductor substrate 108 may be doped or un-doped. In a specific example, the semiconductor substrate 108 is a bulk silicon substrate. Devices, such as transistors, diodes, capacitors, resistors, etc., may be formed in and/or on the semiconductor substrate 108 and may be interconnected by interconnect structures 110 formed by, for example, metallization patterns in one or more dielectric layers on the semiconductor substrate 108 to form an integrated circuit.

The integrated circuit dies 104 further comprise pads 112, such as aluminum pads, to which external connections are made. The pads 112 are on what may be referred to as respective active sides of the integrated circuit dies 104. Passivation films 114 are on the integrated circuit dies 104 and on portions of the pads 112. Openings are through the passivation films 114 to the pads 112. Die connectors 116, such as conductive pillars (for example, comprising a metal such as copper), are in the openings through passivation films 114 and are mechanically and electrically coupled to the respective pads 112. The die connectors 116 may be formed by, for example, plating or the like. The die connectors 116 electrically couple the respective integrated circuits of the integrated circuit dies 104.

A dielectric material 118 is on the active sides of the integrated circuit dies 104, such as on the passivation films 114 and the die connectors 116. The dielectric material 118 laterally encapsulates the die connectors 116, and the dielectric material 118 is laterally co-terminus with the respective integrated circuit dies 104. The dielectric material 118 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, chemical vapor deposition (CVD), or the like.

Adhesive 106 is on back sides of the integrated circuit dies 104 and adheres the integrated circuit dies 104 to the release layer 102. The adhesive 106 may be any suitable adhesive, epoxy, or the like. The adhesive 106 may be applied to a back side of the integrated circuit dies 104, such as to a back side of the respective semiconductor wafer. The integrated circuit dies 104 may be singulated, such as by sawing or dicing, and adhered to the release layer 102 by the adhesive 106 using, for example, a pick-and-place tool.

Figure 19:
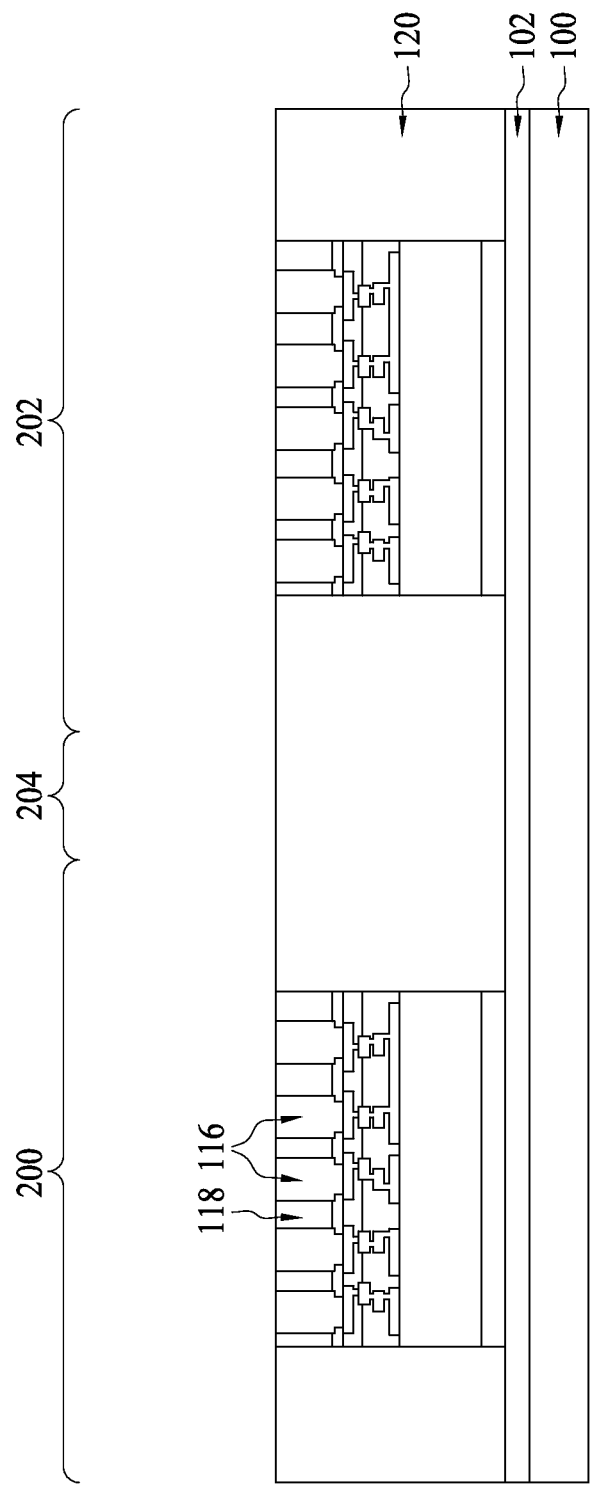

In FIG. 19, an encapsulant 120 is formed on the various components. The encapsulant 120 may be a molding compound, epoxy, or the like, and may be applied by compression molding, transfer molding, or the like. After curing, the encapsulant 120 can undergo a grinding process to expose die connectors 116. Top surfaces of the die connectors 116 and encapsulant 120 are co-planar after the grinding process. In some embodiments, the grinding may be omitted, for example, if the die connectors 116 are already exposed.

In FIGS. 20 through 26, a front side redistribution structure 140 is formed. As will be illustrated in FIG. 26, the front side redistribution structure 140 comprises dielectric layers 122, 126, 130, and 134 and metallization patterns 124, 128, and 132.

Figure 20:
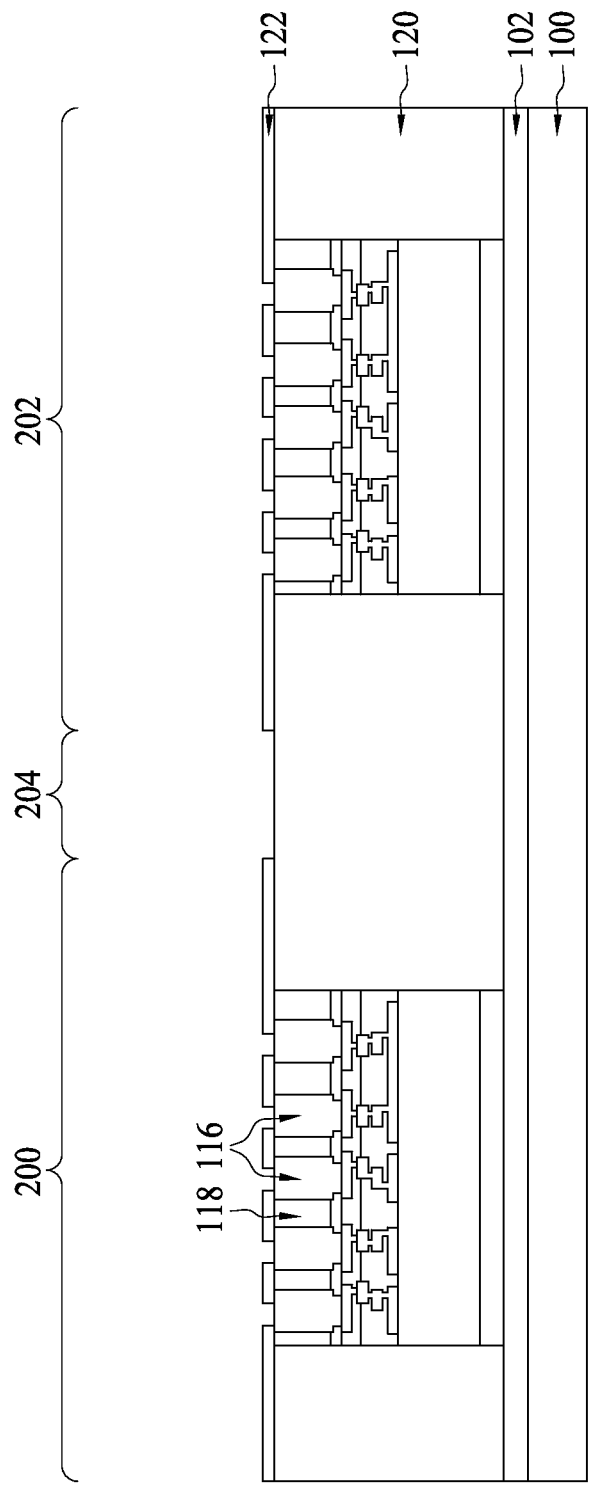

In FIG. 20, the dielectric layer 122 is formed on the encapsulant 120 and the die connectors 116, with via openings exposing the die connectors 116. The dielectric layer 122 can include any of the materials discussed for dielectric layer 48 and can be formed as discussed for dielectric layer 48 in any of the first, second, or third generic processes discussed above with respect to FIGS. 5, 11, and 17, respectively.

Figure 21:
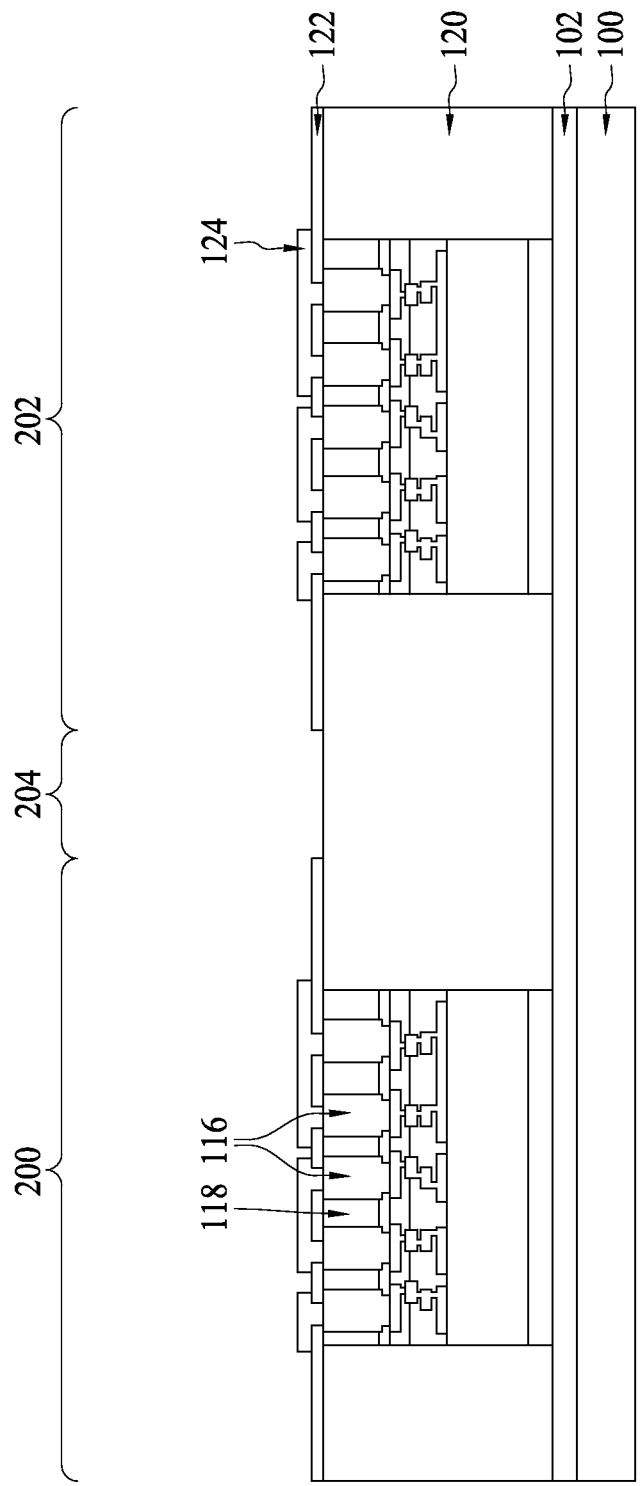

In FIG. 21, metallization pattern 124 with vias is formed on the dielectric layer 122. As an example to form metallization pattern 124, a seed layer (not shown) is formed over the dielectric layer 122 and in openings through the dielectric layer 122. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photo resist is then formed and patterned on the seed layer. The photo resist may be formed by spin coating or the like and may be exposed to light for patterning. The pattern of the photo resist corresponds to the metallization pattern 124. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 124 and vias. The vias are formed in openings through the dielectric layer 122 to, e.g., the die connectors 116.

Figure 22:
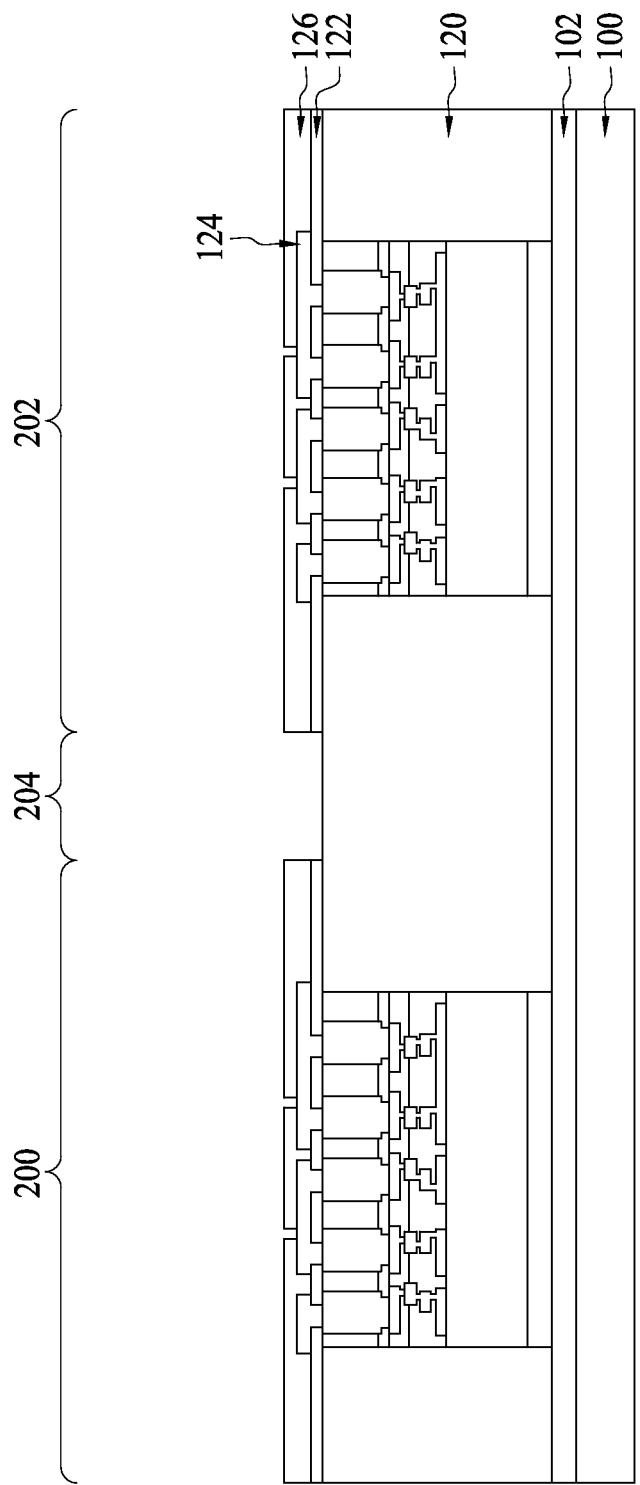

In FIG. 22, the dielectric layer 126 is formed on the metallization pattern 124 and the dielectric layer 122, with via openings exposing the metallization pattern 124. The dielectric layer 126 can include any of the materials discussed for dielectric layer 48 and can be formed as discussed for dielectric layer 48 in any of the first, second, or third generic processes discussed above with respect to FIGS. 5, 11, and 17, respectively.

Figure 23:
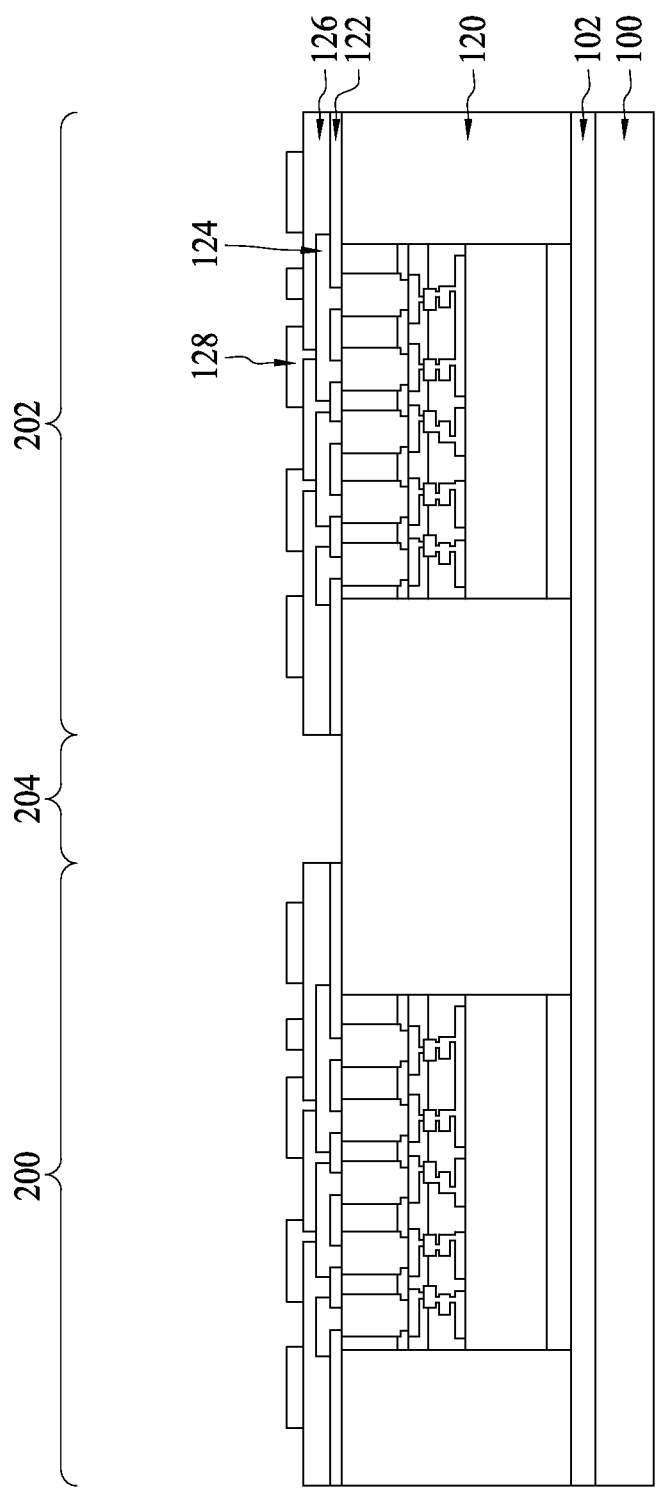

In FIG. 23, metallization pattern 128 with vias is formed on the dielectric layer 126. As an example to form metallization pattern 128, a seed layer (not shown) is formed over the dielectric layer 126 and in openings through the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 128. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 128 and vias. The vias are formed in openings through the dielectric layer 126 to, e.g., portions of the metallization pattern 124.

Figure 24:
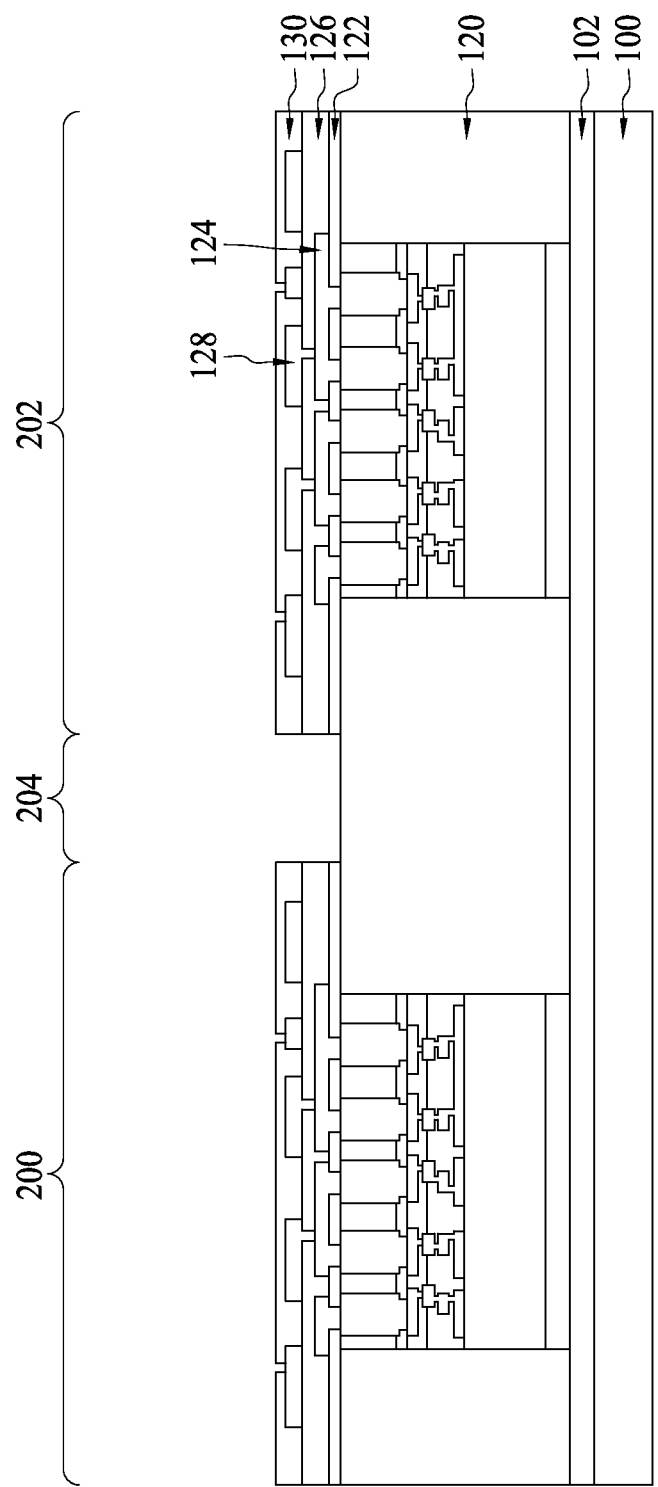

In FIG. 24, the dielectric layer 130 is formed on the metallization pattern 128 and the dielectric layer 126, with via openings exposing the metallization pattern 128. The dielectric layer 130 can include any of the materials discussed for dielectric layer 48 and can be formed as discussed for dielectric layer 48 in any of the first, second, or third generic processes discussed above with respect to FIGS. 5, 11, and 17, respectively.

Figure 25:
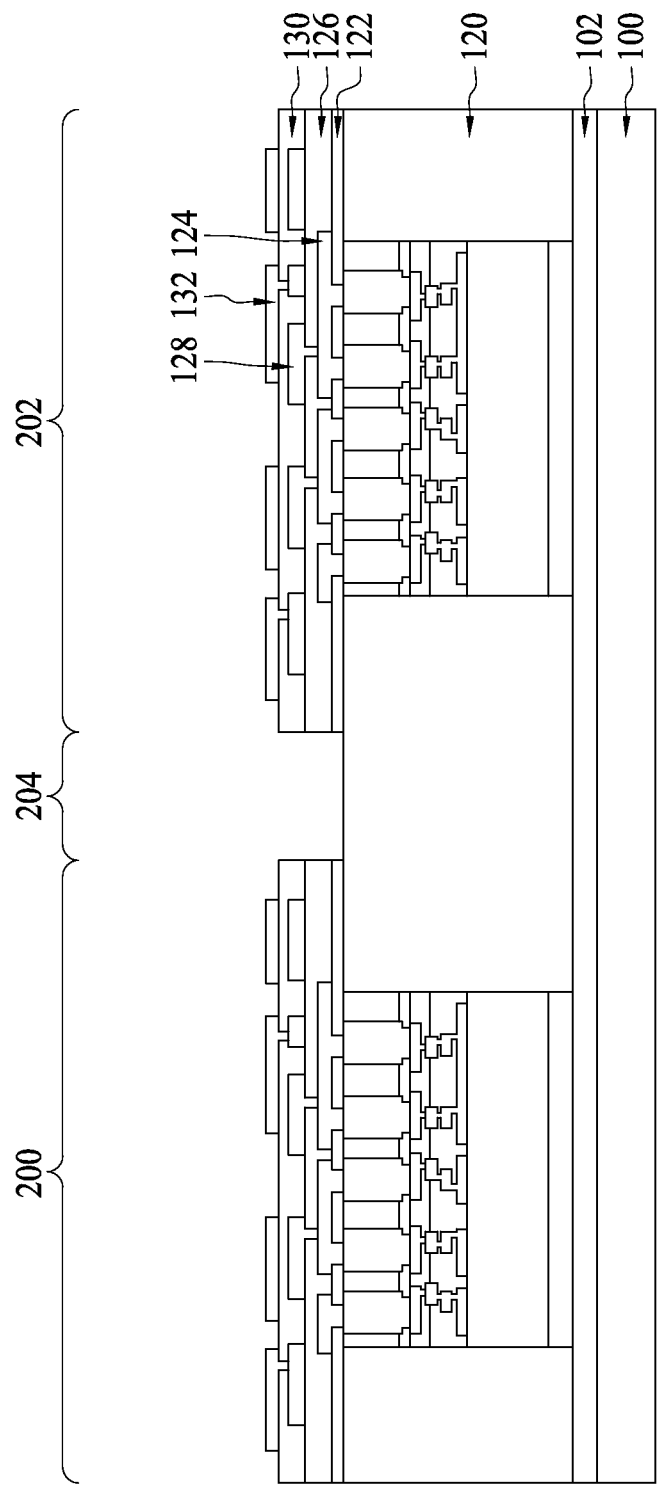

In FIG. 25, metallization pattern 132 with vias is formed on the dielectric layer 130. As an example to form metallization pattern 132, a seed layer (not shown) is formed over the dielectric layer 130 and in openings through the dielectric layer 130. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 132. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 132 and vias. The vias are formed in openings through the dielectric layer 130 to, e.g., portions of the metallization pattern 128.

Figure 26:
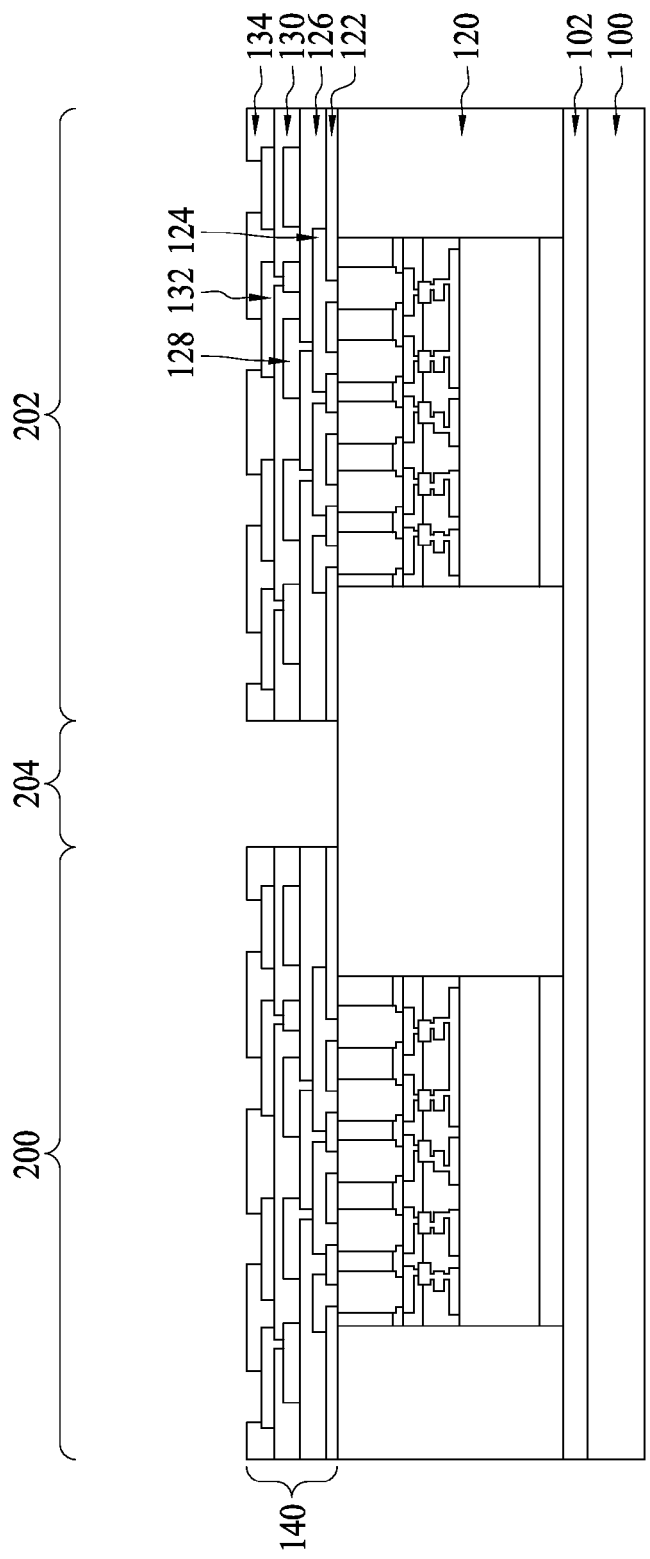

In FIG. 26, the dielectric layer 134 is formed on the metallization pattern 132 and the dielectric layer 130, with openings exposing the metallization pattern 132. The dielectric layer 134 can include any of the materials discussed for dielectric layer 48 and can be formed as discussed for dielectric layer 48 in any of the first, second, or third generic processes discussed above with respect to FIGS. 5, 11, and 17, respectively.

The front side redistribution structure 140 is shown as an example. More or fewer dielectric layers and metallization patterns may be formed in the front side redistribution structure 140. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 27:
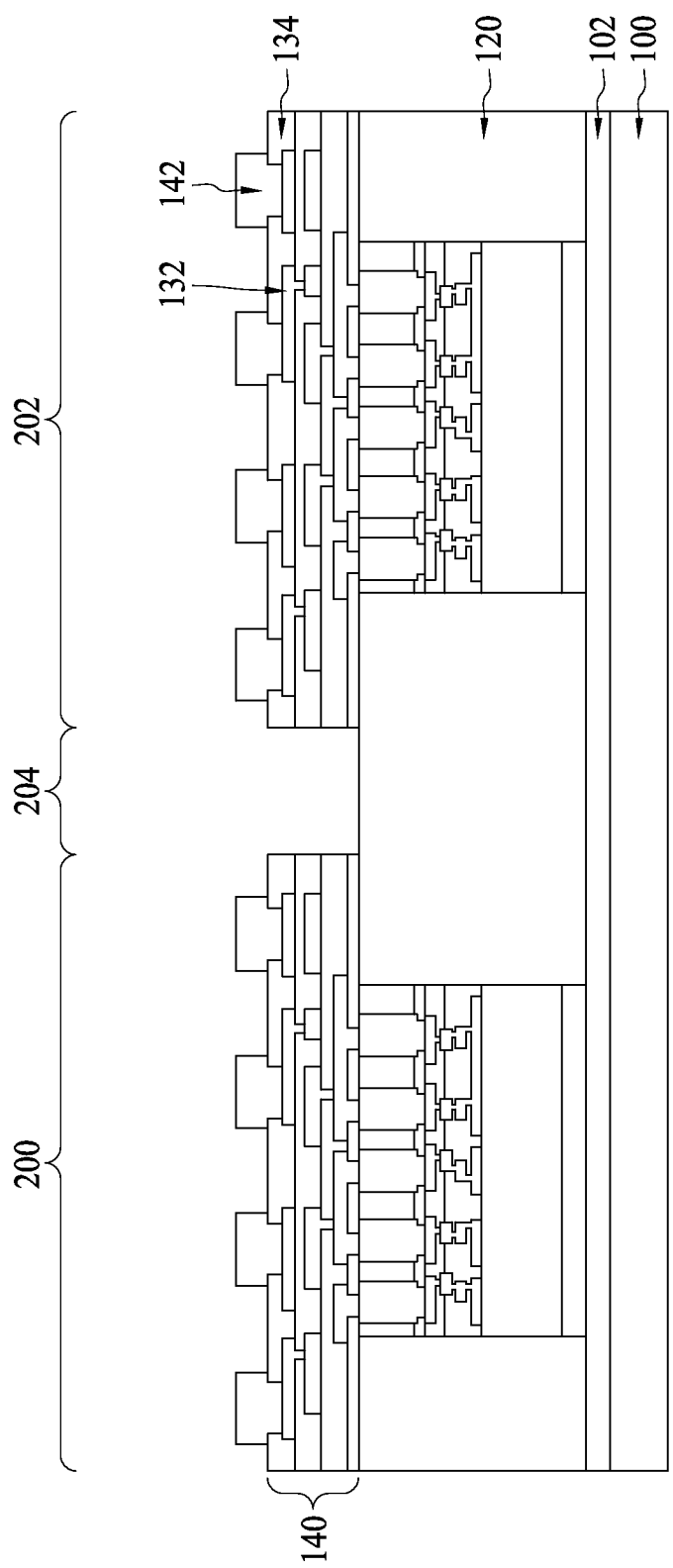

In FIG. 27, pads 142, which may be referred to as Under Bump Metallurgies (UBMs), are formed on an exterior side of the front side redistribution structure 140. In the illustrated embodiment, pads 142 are formed through openings through the dielectric layer 134 to the metallization pattern 132. As an example to form the pads 142, a seed layer (not shown) is formed over the dielectric layer 134. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 142. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 142.

Figure 28:
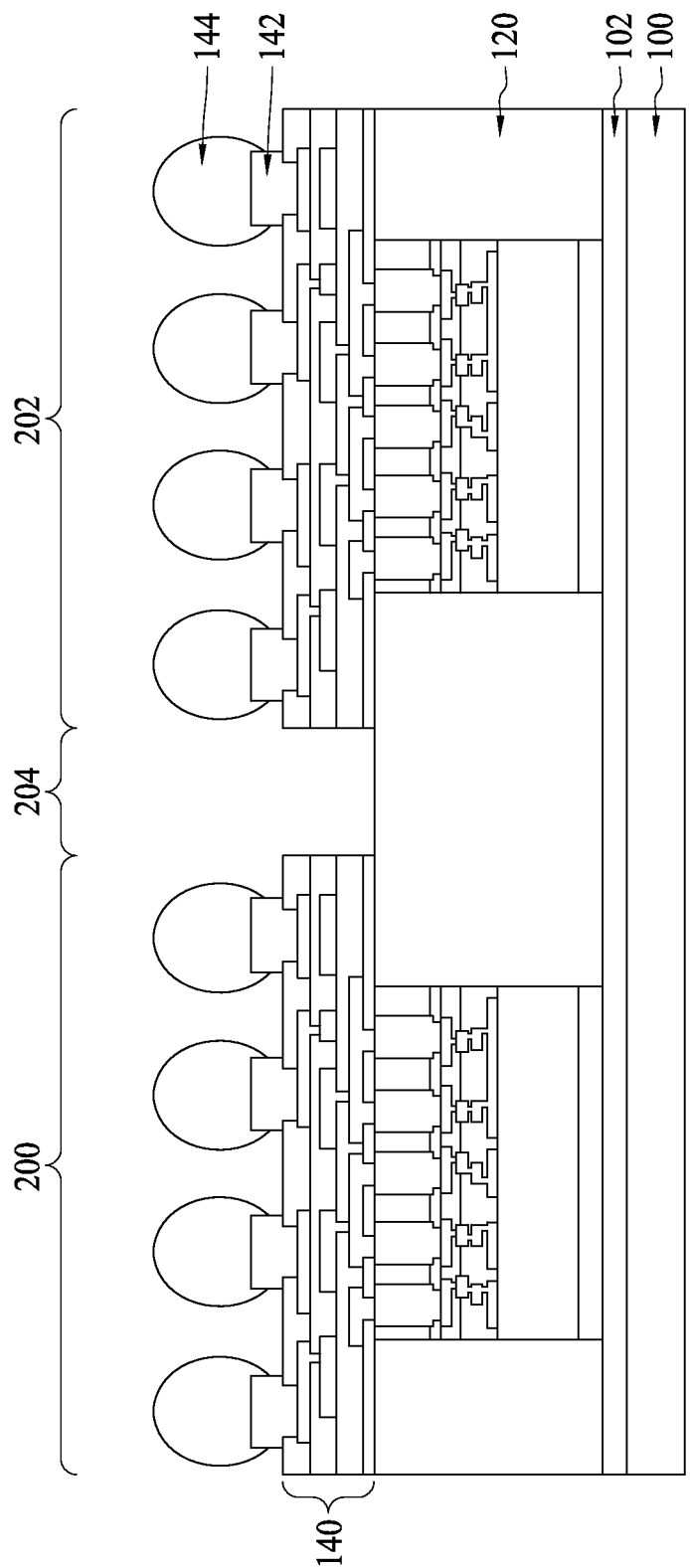

In FIG. 28, external electrical connectors 144, such as solder balls like ball grid array (BGA) balls, are formed on the pads 142. The external electrical connectors 144 may include a low-temperature reflowable material such as solder, which may be lead-free or lead-containing. The external electrical connectors 144 may be formed by using an appropriate ball drop process. In some embodiments, the pads 142 can be omitted, and the external electrical connectors 144 can be formed directly on the metallization pattern 132 through the openings through the dielectric layer 134.

Figure 29:
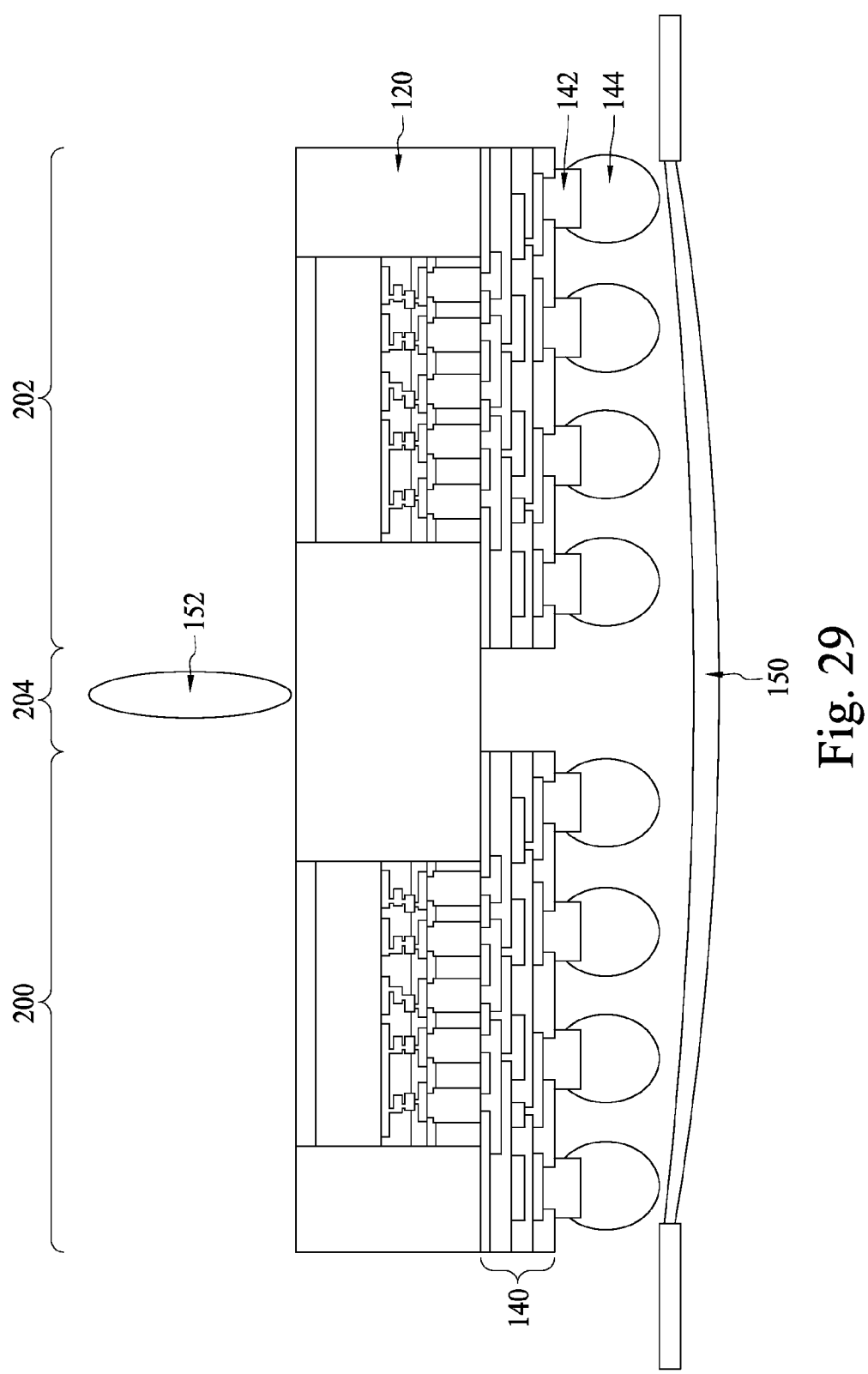
Figure 30:
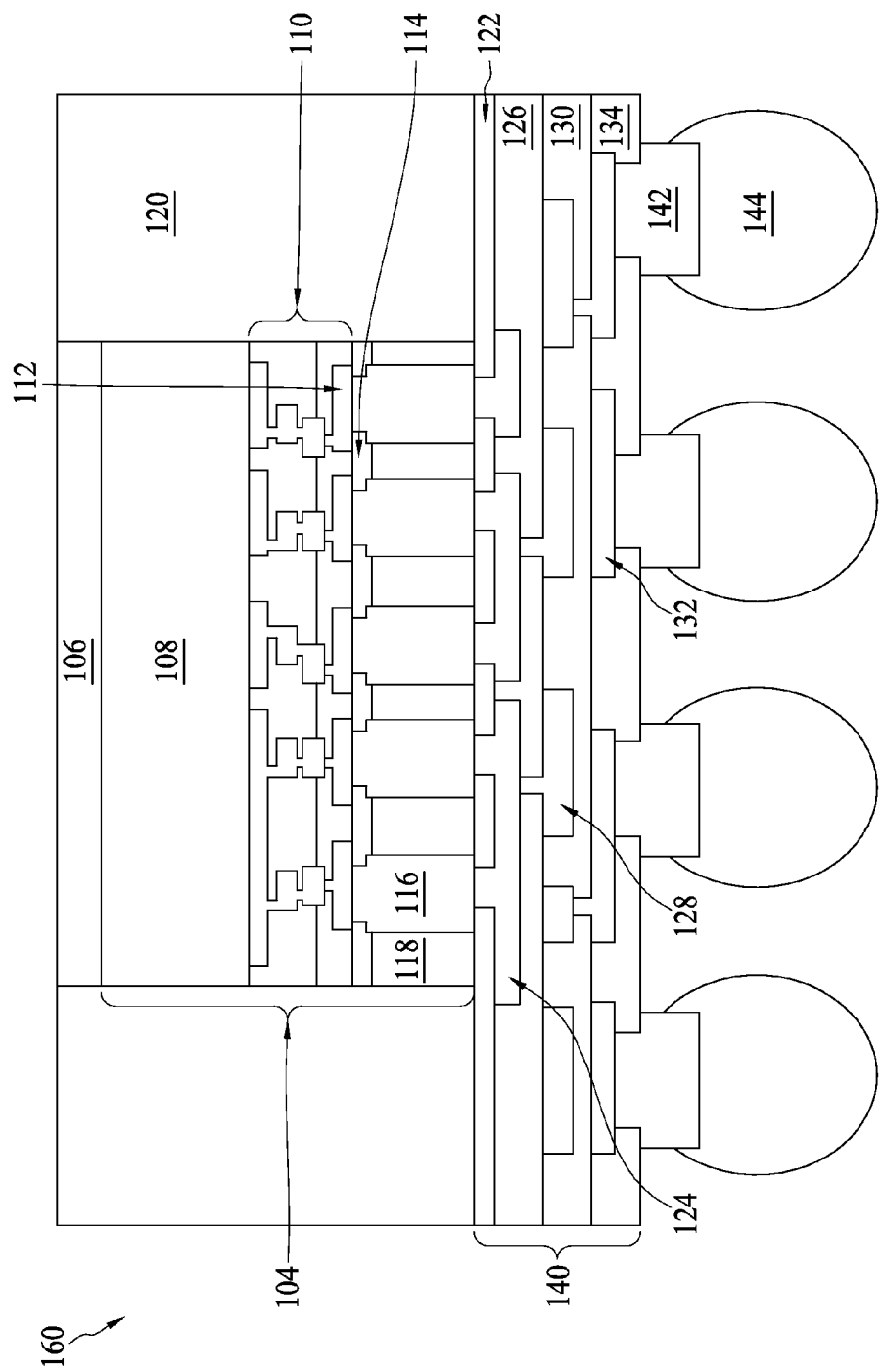
Figure 31:
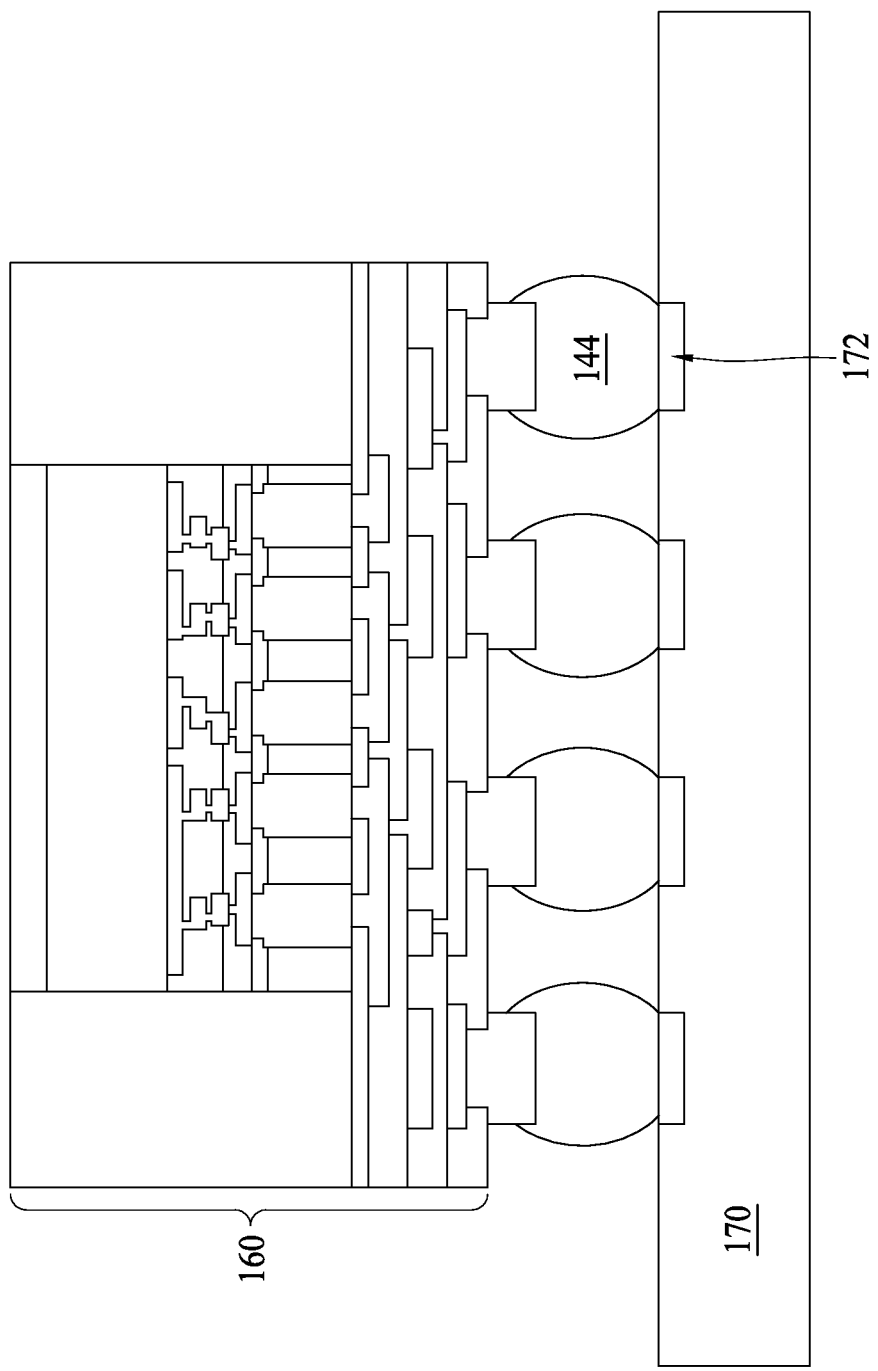

In FIG. 29, a carrier substrate de-bonding is performed to detach (de-bond) the carrier substrate 100 from the encapsulant 120 and the adhesive 106. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 150. Then, a singluation process is performed by sawing 152 along the scribe line regions 204. The sawing 152 singulates the first package region 200 from the second package region 202. FIG. 30 illustrates a resulting, singulated package structure. The singulation results in package 160, which may be from one of the first package region 200 or the second package region 202, being singulated. In FIG. 31, the package structure is attached to a substrate 170. The external electrical connectors 144 are electrically and mechanically coupled to pads 172 on the substrate 170, which may occur by reflowing the external electrical connectors 144. The substrate 170 can be, for example, a printed circuit board (PCB) or the like.

FIG. 32 illustrates a layout to further illustrate aspects of scribe line regions in accordance with some embodiments. FIG. 32 includes package regions 210, such as regions 40, 42, 200, and 202 described above, and scribe line regions 212$y$ and 212$x$, such as scribe line regions 44 and 204 described above. The scribe line regions 212$y$ extend along a Y-direction, and scribe line regions 212$x$ extend along an X-direction. Together, various scribe line regions 212$y$ and 212$x$ can encircle a package region 210.

Some embodiments may achieve advantages. By providing a thin layer, e.g., thin layer 50, on a dielectric layer that is photosensitive, the selectivity of the developing can be increased. For example, as the inventors have discovered, for a positive tone PBO material without a thin layer as discussed above, a developing rate (e.g., removal of exposed area to removal of un-exposed area) can be 1.7:0.5 (or 3.4), and for a positive tone PBO material with a thin layer formed by HMDS gas exposure, the developing rate can be 1.7:0.36 (or 4.7). This improved selectivity can allow for a dielectric layer that can be better developed with reduced thickness loss. For example, residue in scribe line regions and openings through the dielectric layer can be minimized or fully removed to leave clean scribe line regions and openings while allowing the dielectric layer to be fully developed. Further, as discussed previously, thickness uniformity post-development can be increased with the use of a thin layer on the dielectric layer.

An embodiment is a method. The method includes depositing a photosensitive dielectric layer on a support structure; forming a first layer on a surface of the photosensitive dielectric layer; exposing the photosensitive dielectric layer to radiation; and after the forming the first layer and the exposing to radiation, developing the photosensitive dielectric layer. The support structure includes an integrated circuit die. The first layer has a different removal selectivity than the photosensitive dielectric layer during the developing.

Another embodiment is a method. The method comprises at least laterally encapsulating an integrated circuit die with an encapsulant; depositing, in a chamber, a photosensitive layer over the integrated circuit die and the encapsulant; exposing the photosensitive layer to a precursor to react with a surface of the photosensitive layer with the precursor; exposing the photosensitive layer to a pattern of radiation; and after the exposing the photosensitive layer to the precursor and to the pattern of radiation, developing the photosensitive layer. One or more openings corresponding to the pattern of radiation are formed through the photosensitive layer.

A further embodiment is a method. The method comprises depositing a photosensitive dielectric layer on a support structure; increasing a removal selectivity between radiation exposed portions of the photosensitive dielectric layer and radiation un-exposed portions of the photosensitive dielectric layer; exposing the photosensitive dielectric layer to a pattern of radiation; and after the increasing the removal selectivity and the exposing the photosensitive dielectric layer to the pattern, developing the photosensitive dielectric layer. The support structure has a first die-containing region, a second die-containing region, and a scribe line region between the first die-containing region and the second die-containing region. The removal selectivity is during a developing process. After the exposing the photosensitive dielectric layer to the pattern, the photosensitive dielectric layer includes the radiation exposed portions and the radiation un-exposed portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  depositing a photosensitive dielectric layer on a support structure, the support structure comprising an integrated circuit die;
  forming a first layer on a surface of the photosensitive dielectric layer;
  exposing the photosensitive dielectric layer to radiation to form soluble and insoluble portions of the photosensitive dielectric layer; and
  after the forming the first layer and the exposing to radiation, developing the photosensitive dielectric layer by applying a developer, the first layer having a different removal selectivity than the photosensitive dielectric layer during the developing, wherein developing the photosensitive dielectric layer comprises removing the soluble portions of the photosensitive dielectric layer.

2. The method of claim 1, wherein the forming the first layer comprises exposing the surface of the photosensitive dielectric layer to hexamethyldisilazane (HMDS).

3. The method of claim 1, wherein the forming the first layer comprises exposing the surface of the photosensitive dielectric layer to a gas.

4. The method of claim 1, wherein the forming the first layer comprises modifying the surface of the photosensitive dielectric layer by reacting a precursor with the surface of the photosensitive dielectric layer.

5. The method of claim 1, wherein the forming the first layer comprises depositing a photo resist on the surface of the photosensitive dielectric layer.

6. The method of claim 1, wherein the forming the first layer is performed before the exposing the photosensitive dielectric layer to radiation.

7. The method of claim 1, wherein the forming the first layer is performed after the exposing the photosensitive dielectric layer to radiation.

8. The method of claim 1, wherein the forming the first layer is performed before the exposing the photosensitive dielectric layer to radiation, and further comprising forming a second layer on the surface of the photosensitive dielectric layer after the exposing the photosensitive dielectric layer to radiation and before the developing the photosensitive dielectric layer.

9. A method comprising:
  at least laterally encapsulating an integrated circuit die with an encapsulant;
  depositing, in a chamber, a photosensitive layer over the integrated circuit die and the encapsulant;
  exposing the photosensitive layer to a precursor to react with a surface of the photosensitive layer with the precursor;
  exposing the photosensitive layer to a pattern of radiation to form a pattern of soluble portions and a pattern of insoluble portions; and
  after the exposing the photosensitive layer to the precursor and the exposing the photosensitive layer to the pattern of radiation, developing the photosensitive layer by applying a developer to the photosensitive layer, wherein one or more openings corresponding to the pattern of soluble portions are formed through the photosensitive layer during the developing.

10. The method of claim 9, wherein the exposing the photosensitive layer to the precursor is performed in situ in the chamber.

11. The method of claim 9, wherein the precursor is a gas.

12. The method of claim 9, wherein the precursor is hexamethyldisilazane (HMDS).

13. The method of claim 9, wherein the photosensitive layer is polybenzoxazole (PBO).

14. The method of claim 9, wherein the exposing the photosensitive layer to the precursor increases a removal selectivity of a radiation exposed portion of the photosensitive layer to a radiation un-exposed portion of the photosensitive layer during the developing the photosensitive layer.

15. The method of claim 9, wherein the exposing the photosensitive layer to the precursor is performed before the exposing the photosensitive layer to the pattern of radiation.

16. The method of claim 9, wherein the exposing the photosensitive layer to the precursor is performed after the exposing the photosensitive layer to the pattern of radiation.

17. A method comprising:
  depositing a photosensitive dielectric layer on a support structure, the support structure having a first die-containing region, a second die-containing region, and a scribe line region between the first die-containing region and the second die-containing region;
  increasing a removal selectivity between radiation exposed portions of the photosensitive dielectric layer and radiation un-exposed portions of the photosensitive dielectric layer, the removal selectivity being during a developing process;
  exposing the photosensitive dielectric layer to a pattern of radiation, wherein after the exposing the photosensitive dielectric layer to the pattern of radiation, the photosensitive dielectric layer includes the radiation exposed portions and the radiation un-exposed portions; and
  after the increasing the removal selectivity and the exposing the photosensitive dielectric layer to the pattern of radiation, developing the photosensitive dielectric layer, wherein the developing the photosensitive dielectric layer comprises applying a developer and removing soluble portions of the photosensitive dielectric layer, the soluble portions being either the radiation exposed portions or the radiation un-exposed portions in the photosensitive dielectric layer.

18. The method of claim 17, wherein the scribe line region is free from residue of the photosensitive dielectric layer after the developing.

19. The method of claim 17, wherein after the developing, the photosensitive dielectric layer across the first die-containing region and the second die-containing region has a standard deviation of a thickness equal to or less than 4%.

20. The method of claim 17, wherein after the developing, the photosensitive dielectric layer in the first die-containing region has a standard deviation of a thickness equal to or less than 1%.

\* \* \* \* \*